United States Patent
Hidaka

[11] Patent Number: 5,847,430
[45] Date of Patent: Dec. 8, 1998

[54] INPUT PROTECTION CIRCUIT FOR SEMICONDUCTOR DEVICE

[75] Inventor: Hideto Hidaka, Hyogo, Japan

[73] Assignee: Mitsubishi Denki Kabushiki Kaisha, Tokyo, Japan

[21] Appl. No.: 865,264

[22] Filed: May 29, 1997

Related U.S. Application Data

[63] Continuation of Ser. No. 626,107, Apr. 3, 1996, abandoned.

[30] Foreign Application Priority Data

Nov. 27, 1995 [JP] Japan .................................. 7-307591

[51] Int. Cl.$^6$ ................................................... H01L 23/62
[52] U.S. Cl. ......................... 257/355; 257/356; 257/357; 257/358; 257/363
[58] Field of Search .................................... 257/173, 174, 257/328, 355, 356, 357, 358, 359, 360, 361, 362, 363, 452, 546

[56] References Cited

U.S. PATENT DOCUMENTS

| | | | |
|---|---|---|---|
| 4,924,339 | 5/1990 | Atsumi et al. ........................ | 257/360 |
| 4,937,639 | 6/1990 | Yao et al. ............................. | 257/360 |
| 4,943,835 | 7/1990 | Yakushiji et al. ..................... | 257/173 |
| 5,235,201 | 8/1993 | Honna .................................. | 257/328 |
| 5,237,187 | 8/1993 | Suwanai et al. ....................... | 257/296 |

FOREIGN PATENT DOCUMENTS 000488340  11/1990  Japan .................................. 257/173

*Primary Examiner*—Carl W. Whitehead, Jr.
*Attorney, Agent, or Firm*—McDermott, Will & Emery

[57] ABSTRACT

Between an external power supply line and an internal power supply line in which an internal power supply potential is transmitted on a substrate region, a high voltage conducting mechanism is provided, which is rendered conductive when a transitional high voltage surge is generated at the external power supply line by electrically connecting the external power supply line and the internal power supply line. Even when the ground line and external power supply line are not arranged parallel to each other, a high voltage conducting mechanism constituted by a field transistor or an insulated gate type field effect transistor having wide width over a long distance can be formed.

21 Claims, 15 Drawing Sheets

INPUT PROTECTION CIRCUIT FOR SEMICONDUCTOR DEVICE

This application is a continuation of application Ser. No. 08/626,107 filed Apr. 3, 1996 and now abandoned.

BACKGROUND OF THE INVENTION

1. Field of the Invention

The present invention relates to an input protection circuit for protecting internal circuitry from a transitional high voltage surge applied externally to a power supply input terminal and a signal input/output terminal of a semiconductor device. More specifically, it relates to a structure for protecting internal circuitry from a high voltage surge applied to a power supply input terminal of a semiconductor integrated circuit.

2. Description of the Background Art

FIGS. 26A and 26B show a layout and a cross sectional structure, respectively, of a conventional semiconductor device such as a dynamic random access memory. Referring to FIG. 26A, to a power supply input pad 1 formed, for example, of aluminum (Al), a power supply voltage Vcc is externally applied through an external pin terminal not shown. To power supply input pad 1, a relatively wide power supply line 2 formed of aluminum, for example, is connected to transmit the externally applied power supply potential Vcc to internal circuitry. Parallel to power supply line 2, a relatively wide ground line 3 formed of, for example, aluminum for transmitting a ground potential GND is arranged. Ground line 3 is connected to a ground potential input pad, not shown.

In a region where power supply line 2 and ground line 3 are arranged adjacent to each other, below power supply line 2 and ground line 3, field regions 4 and 5 are formed by highly doped impurity regions. Field regions 4 and 5 are connected through contact holes (or via holes) 4a and 5a, respectively to the lines 2 and 3. Referring to FIG. 26A, field regions 4 and 5 are shown constituted by N type impurity regions.

Referring to FIG. 26B, field regions 4 and 5 are formed being spaced from each other at a surface of a P type semiconductor substrate 6. Between field regions 4 and 5, a field insulating film 7a for isolating elements is formed. Generally, field insulating film 7a is formed by LOCOS (Local Oxidation of Silicon) film. Outside field region 4 and 5, LOCOS isolation oxide film 7b for isolation from other regions are formed.

Field regions 4 and 5 and field insulating film 7a together constitute an element commonly referred to as a field transistor. On field insulating film 7a, a gate electrode layer is formed, which gate electrode layer may be electrically connected to field region 5. Field region 4 is connected to receive the externally applied power supply potential Vcc through node 4b, and field region 5 is connected to receive the ground potential GND through node 5b. Node 4b is either a node of power supply line 2 or power supply input pad 1 shown in FIG. 26A. Node 4b may be an external power supply terminal. Similarly, node 5b receiving the ground potential GND is any node on ground line 3, a ground input pad, or an external ground input terminal.

Field regions 4 and 5 and field insulating film 7a constitute an input protection circuit against transitional high voltage surge applied to power supply input pad 1 or to node 4b. The operation of the input protection circuit will be briefly described.

When a transitional high voltage surge is applied to power supply input pad 1 or node 4b, potential at field region 4 becomes higher, and a reverse bias is applied to a junction interface between field region 4 and substrate 6. By the high voltage applied to field region 4, a depletion layer expands, a lateral parasitic bipolar transistor having an npn structure in which field region 4, substrate 6 and field region 5 served as collector, base and emitter, respectively, suffers from a punch through phenomenon and is rendered conductive. Thus, the high voltage surge which has been input to the power supply input pad 1 or node 4b is transmitted to node 5b through field region 4, substrate region 6 and field region 5, and thereafter transmitted from node 5b to ground line 3, so that the high voltage surge is absorbed. When the parasitic bipolar transistor is rendered conductive, there is a breakdown at a junction between field region 4 and substrate 6, a current flows from field region 4 to substrate 6, and the high voltage surge applied to node 4b or power supply input pad 1 is absorbed through substrate 6 (here, substrate 6 is biased to a prescribed potential level such as ground potential, or a negative voltage Vbb).

By providing such an input protection circuit for the power supply input pad, application of a high voltage to a circuit utilizing power supply potential Vcc applied to the power supply input pad 1 can be prevented, and hence destruction of the internal circuit using the power supply voltage Vcc can be prevented.

When a transitional high voltage surge is applied, it is necessary to absorb the high voltage surge at high speed. In order to discharge the high voltage surge at high speed from power supply line 2 to ground line 3, it is necessary to sufficiently greaten the channel width (length of a portion where field regions 4 and 5 face each other in FIG. 26A) of the field transistor. Therefore, a large layout area is necessary for the input protection circuit. The field transistor is formed utilizing a portion where power supply line 2 and ground line 3 are arranged adjacent to and opposed to each other. However, generally, it is difficult to ensure the region as mentioned above where power supply line 2 and ground line 3 are arranged opposing to and adjacent to each other. Especially in a highly integrated semiconductor integrated circuit, it is difficult to ensure such region, and hence the channel of the field transistor cannot be sufficiently widened, it is difficult to provide a protection circuit having sufficient surge absorbing capability.

In a recent semiconductor memory device, referring to FIG. 27, an external power supply voltage Vcc applied to the power supply input pad 1 is down-converted by a down converter 8 to generate an internal power supply potential Vint, which in turn is transmitted to an internal power supply line 9. Internal circuit operates using the internal power supply potential Vint on the internal power supply line 9. This is to reduce power consumption and increase speed of operation of the semiconductor memory device, and to provide compatibility with operational power supply potential outside the device to maintain compatibility with conventional semiconductor memory devices.

Further, referring to FIG. 28, circuit portion of a semiconductor memory device is divided into groups and power supply input pad is provided separately for each group, so as to stabilize operations of the internal circuits.

Referring to FIG. 28, a semiconductor memory device (dynamic random access memory) includes an internal circuit 11 receiving, through power supply line 2a, power supply potential Vcc externally applied to power supply input pad 1a, and a data output circuit 12 receiving, through power supply line 2b, power supply potential Vcc externally applied to a power supply input pad 1b, for generating an external read data from internal data applied through a not shown path, and providing read data Q to a data output pad 13.

Data output circuit 12 requires larger current drivability in order to drive large load such as external circuitry connected to data output pad 13, external interconnections and so on at high speed, and hence consumes larger current. In order to prevent fluctuation of power supply potential Vcc (VQcc) caused by the data output operation of data output circuit 12 from affecting the operation of internal circuitry 11, power supply input pads 1a and 1b are provided separately.

In the structures such as shown in FIGS. 27 and 28, power supply input pads 1, 1a and 1b are provided near the circuits for which the pads are necessary, and accordingly, power supply lines 2, 2a and 2b transmitting external power supply potentials Vcc and VQcc are made shorter. As compared with a structure in which power supply potential Vcc is supplied to all circuits in a semiconductor memory device 10 from only one power supply input pad, the circuits which are associated with one pad are limited in number, and hence power supply lines 2, 2a and 2b are made smaller. Therefore, line stray capacitances of power supply lines 2, 2a and 2b become smaller.

When a high voltage surge is input, the period in which the surge is applied is relatively short, and a large amount of charges are supplied within the short period of time. When a prescribed amount of charges are supplied as a surge while the power supply lines 2, 2a and 2b have small line stray capacitances, the value of the stray capacitance C is small and the value Q is constant, a large voltage V is applied to the lines based on the relation V=Q/C, and thus power supply lines 2, 2a and 2b are broken, resulting in insufficient surge immunity.

Further, as shown in FIGS. 27 and 28, since power supply lines 2, 2a and 2b are made shorter, the region in which such a field transistor as shown in FIG. 26 is arranged becomes narrower correspondingly, and hence field transistor or an input protection circuit having sufficient layout area cannot be arranged. If the layout area of the input protection circuit becomes small, the channel width becomes narrower, which means that a large current cannot be driven and the high voltage surge cannot be discharged at high speed. Accordingly a large reverse bias voltage would be applied across the junction between field region 4 and substrate 6 shown in FIG. 26B, causing junction breakdown, resulting in lower surge immunity.

SUMMARY OF THE INVENTION

An object of the present invention is to provide an input protection circuit providing significantly improved surge immunity of an external terminal, especially a power supply input terminal, without increasing chip size.

In summary, the input protection circuit in accordance with the present invention includes a high voltage conducting mechanism connected between an external power supply terminal and an internal fixed potential supply source, which is rendered conductive when a high voltage is applied, for electrically coupling the external terminal with the fixed potential supply source. The present invention includes various specific embodiments, of which typical structures are listed below.

The input protection circuit in accordance with a first aspect include a high voltage conducting mechanism including an external power supply node receiving an externally applied power supply potential for supplying it to the inside, an internal power supply potential generating circuit converting the external power supply potential supplied from the external power supply node for generating an internal power supply potential at an internal power supply node, a first node coupled to the external power supply node, and a second node coupled to the internal power supply node, which mechanism is rendered conductive when a voltage higher than normal voltage of the external power supply potential is applied to the first node, for electrically interconnecting the first and second nodes.

The input protection circuit in accordance with a second aspect includes a high voltage conducting mechanism including a plurality of external power supply pads to each of which a power supply potential is applied externally, a first node coupled to a first one of the plurality of external power supply pads, and a second node coupled to a second one, which is different from the first one, of the plurality of external power supply pads, which mechanism is rendered conductive when a voltage higher than a normal voltage level of the external power supply potential is applied to the first node for electrically intercoupling the first and second nodes.

The input protection circuit in accordance with a third aspect includes a high voltage conducting mechanism including an external power supply pad to which an external power supply potential is supplied, a first node coupled to the external power supply pad and a second node connected to a semiconductor substrate, which mechanism is rendered conductive when a potential higher than a normal potential of the external power supply potential is applied to the first node for electrically interconnecting the first and second nodes.

The input protection circuit in accordance with a fourth aspect includes a first substrate region connected to a first node and on which a circuit element using an external power supply potential is formed, and an impurity region connected to a second node, arranged adjacent to and spaced from the substrate region in two dimensional layout.

The input protection circuit in accordance with a fifth aspect includes a high voltage conducting mechanism including an external power supply pad receiving an externally applied power supply potential for transmitting it to the inside, a first node coupled to the external power supply pad, and a second node, which mechanism is rendered conductive when a voltage higher than a normal voltage of the external power supply potential is applied to the first node, for electrically interconnecting the first and second nodes. The second node is connected to a semiconductor substrate, which in turn is biased to a potential different from a ground potential and constitutes a semiconductor chip having the semiconductor device formed thereon.

The input protection circuit in accordance with a sixth aspect includes an external power supply pad receiving an externally applied power supply potential, a conductive line arranged on and around an outer periphery of a semiconductor chip on which a semiconductor device is formed and electrically connected to a semiconductor substrate providing the semiconductor chip, and a high voltage conducting mechanism arranged between the external power supply pad and the conductive line, which mechanism is rendered conductive when a potential level higher than a normal potential level of the external power supply potential is applied to the external power supply pad, for electrically interconnecting the external power supply pad and a conductive line.

For a node to which an external power supply potential is applied, a conductive line to which a fixed potential is supplied and which is arranged parallel to and close to the external power supply line is applied. Different from the prior art, it becomes unnecessary to provide an input protection circuit only at that portion in which a power supply line and a ground line are provided parallel to each other. Therefore, necessary area can be easily ensured, and hence an input protection circuit having superior surge immunity can be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
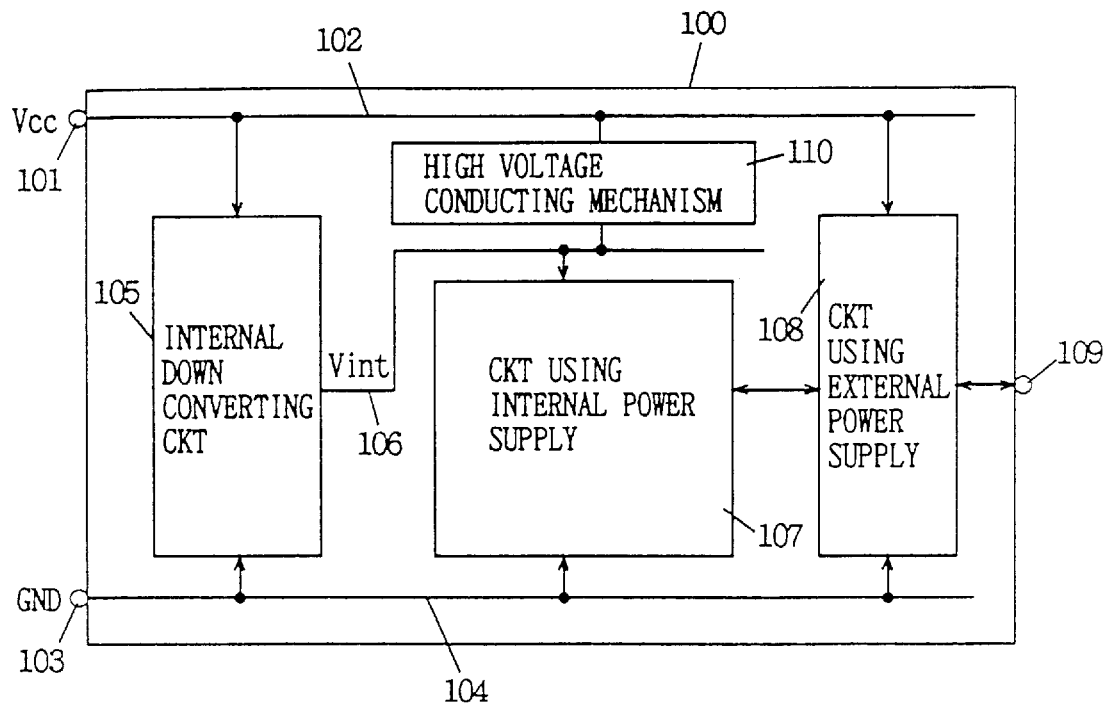
FIG. 1 schematically shows a whole structure of a semiconductor device in accordance with a first aspect of the present invention.

FIG. 1 schematically shows a whole structure of a semiconductor device in accordance with the first embodiment of the present invention. Referring to FIG. 1, a semiconductor device 100 includes an external power supply line 102 receiving, through an external power supply terminal 101, an externally applied external power supply potential Vcc for internal transmission; a ground line 104 receiving, through an external ground terminal 103, an externally applied ground potential GND for internal transmission to the inside; an internal down converting circuit which operates using the potentials on external power supply line 102 and ground line 104 as two operational power supply potentials, for converting the external power supply potential Vcc on external power supply line 102 to generate an internal power supply potential Vint onto an internal power supply line 106; a circuit 107 which operates using the internal power supply potential Vint and the ground potential GND on ground line 104 as two operational power supply potentials to implement a prescribed function; and a circuit 108 using external power supply, which operates using the external power supply potential Vcc on the external power supply line 102 and the ground potential GND on ground line 104 as two operational power supply potentials, for inputting/outputting signals to and from circuit 107 using internal power supply and the outside device (external terminal 109).

A circuit 108 using the external power supply includes, assuming that semiconductor device 100 is a semiconductor memory device, a data input/output circuit for inputting/ outputting data, and an input buffer circuit for inputting control signals and address signals. A portion serving as an interface between the outside of the device, and the data input/output circuit and the input buffer circuit uses the external power supply potential Vcc. Circuit 107 using internal power supply includes, assuming that semiconductor device 100 is a semiconductor memory device, a circuit portion driving a memory cell array. Whether a peripheral circuit (decoder or others) provided in the periphery of the memory cell array uses internal power supply potential or external power supply potential is determined on the structure of the semiconductor memory device applied.

Semiconductor device 100 further includes a high voltage conducting mechanism 110 arranged between external power supply line 102 and internal power supply line 106. High voltage conducting mechanism 110 has one conduction node (first node) coupled to external power supply line 102 and the other conduction node (second node) coupled to internal power supply line 106, it is rendered conductive when a high voltage surge is applied to external power supply line 102, and electrically connects external power supply line 102 and internal power supply line 106. Generally, external power supply line 102 and internal power supply line 106 are arranged parallel to each other over a long distance as shown in FIG. 1 (in order to facilitate layout of power supply lines)

Therefore, even when ground line 104 and external power supply line 102 are arranged away from each other and a region in which these lines arranged parallel to each other cannot be ensured, high voltage conducting mechanism 110 has a sufficient layout area. Even when a transitional high voltage surge is applied to external power supply line and the high voltage surge is discharged to internal power supply line 106, internal power supply line 106 has large stray capacitance, since there is a large stray capacitance of internal power supply line 106 itself and a parasitic capacitance of circuit 107 using the internal power supply, it can sufficiently absorb the transitional high voltage surge.

Figure 2:
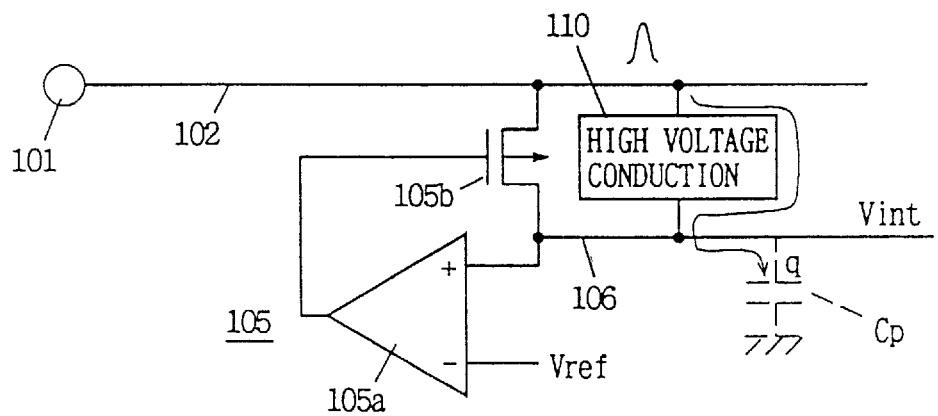
FIG. 2 shows an example of a structure of an internal down converting circuit shown in FIG. 1.

FIG. 2 shows a detailed structure of internal down converting circuit 105 shown in FIG. 1. Internal down converting circuit 105 shown in FIG. 2 includes a comparator 105$a$ comparing internal power supply potential Vint on internal power supply line 106 and a reference potential Vref which is, for example, 2.5 V; and a drive transistor 105$b$ constituted by a p channel MOS transistor (insulated gate type field effect transistor) connected between external power supply line 102 and internal power supply line 106 and receiving at its gate an output signal from comparator 105$b$. When internal power supply potential Vint on internal power supply line 106 is higher than the reference potential Vref, comparator 105$a$ outputs a signal at an H level (high level), and turns off the drive transistor 105$b$. If the internal power supply potential Vint is lower than the reference potential Vref, comparator 105$a$ provides an output signal at an L (low) level, increasing conductance of drive transistor 105$b$. Consequently, drive transistor 105$b$ supplies a current from an external power supply line 102 to internal power supply line 106, so as to increase the potential level of internal power supply potential Vint. Therefore, internal power supply potential Vint is kept at the same potential level as reference potential Vref. The reference potential Vref is generally generated from external power supply potential Vcc.

When a transitional high voltage surge (a pulse-like high voltage noise having the order of KV) at a voltage level higher than the normal potential level (for example, 3.3 V) of the external power supply potential Vcc is supplied to external power supply line 102, high voltage conducting mechanism 110 is rendered conductive, electrically connecting external power supply line 102 and internal power supply line 106. There is a stray capacitance Cp provided by the circuit 107 using the internal power supply on internal power supply line 106, and charges Q applied by the transitional high voltage surge are absorbed by the stray capacitance Cp. Since the stray capacitance Cp is sufficiently large, the high voltage surge can be absorbed without any influence on the potential level of the internal power supply potential Vint on internal power supply line 106. Therefore, it can prevent the transitional high voltage surge from damaging the circuit 107 using the internal power supply and the circuit 108 using the external power supply shown in FIG. 1.

Figure 3A:
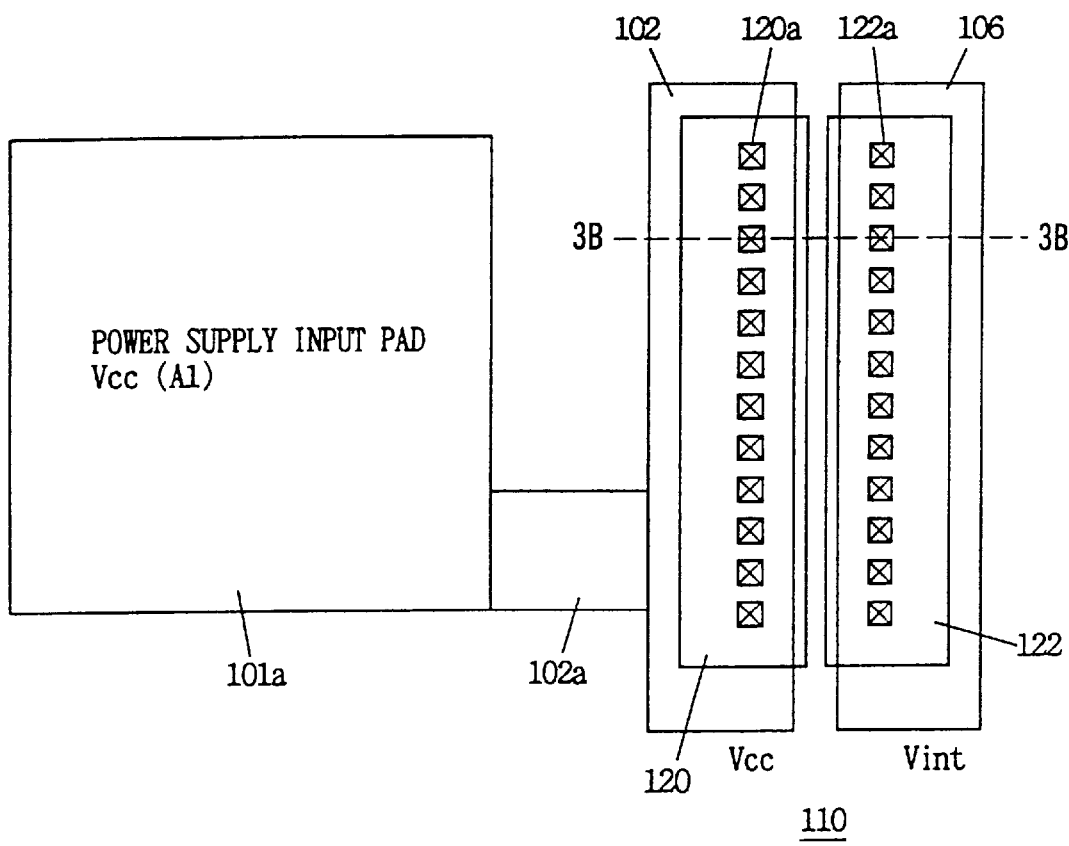
FIG. 3A is a planar layout of a high voltage conducting mechanism shown in FIG. 1, and FIG. 3B schematically shows a cross sectional structure taken along the line 3B—3B of FIG. 3A.
Figure 3B:
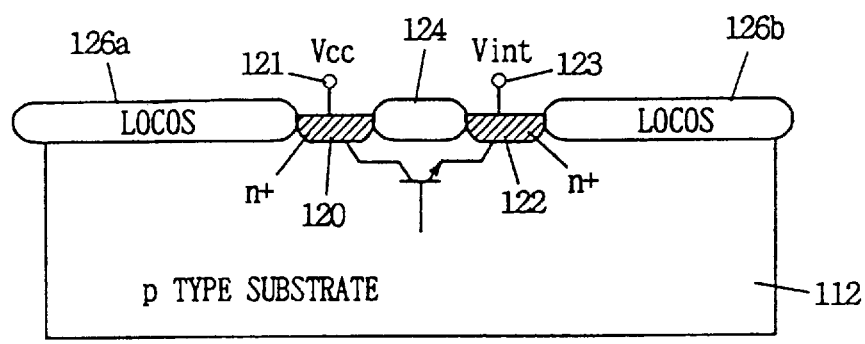

FIGS. 3A and 3B show a greater detail of the structure of the high voltage conducting mechanism shown in FIGS. 1 and 2. Referring to FIG. 3A, external power supply line 102 is formed, for example, of aluminum (Al) and connected to power supply input pad 101$a$ connected to external power supply terminal 101 shown in FIG. 1 through a conductive layer 102$a$ formed, for example, of an aluminum interconnection layer, receives external power supply potential Vcc from power supply input pad 101$a$ and transmits it to the inside. Internal power supply line 106 formed of, for example, aluminum is arranged parallel to external power supply line 102.

High voltage conducting mechanism 110 includes a field region 120 electrically connected to external power supply line 102 through contact hole (or via hole) 120$a$, and a field region 102 electrically connected to internal power supply line 106 through a contact hole (or via hole) 122$a$. Field regions 120 and 122 are arranged parallel to and spaced apart from each other. The space between field regions 120 and 122 is made at most 3 $\mu$m so that a punch through is generated when a high voltage is applied, facilitating electrical connection between field regions 120 and 122.

FIG. 3B shows a cross sectional structure taken along the line 3B—3B shown in FIG. 3A. Referring to FIG. 3B, field regions 120 and 122 are provided by highly doped n type impurity regions formed spaced apart from each other at the surface of a p type semiconductor substrate 112. Field region 120 receives the external power supply potential Vcc applied to power supply input pad 101$a$ through a first node 121. Field region 122 is connected to receive internal power supply potential Vint through a second node 123. The first and second nodes 121 and 123 represent nodes on power supply lines 102 and 106, respectively.

At a surface of the semiconductor substrate 112 between field regions 120 and 122, a field insulating 124 is formed, for example, through thermal oxidation. A gate electrode layer may be formed on field insulating film 124. Outside the field regions 120 and 122, LOCOS oxide films 126$a$ and 126$b$ are formed. Field region 120, semiconductor substrate 112 and field region 122 constitute a lateral npn parasitic bipolar transistor. When a transitional high voltage surge is applied to the first node 121 and the voltage level thereof increases, the potential at field region 120 increases, a depletion layer expands and field regions 120 and 122 are electrically connected, that is, so called punch through occurs. Thus, the high voltage surge generated at the first node is transmitted to the second node 123 through field region 122, and absorbed by internal power supply line 106. If the transitional high voltage surge is high, there would be a break (breakthrough) of n+/p junction formed between field region 120 and p type semiconductor substrate 112, charges are supplied from field region 120 to semiconductor substrate 112, and the charges are also absorbed by semiconductor substrate 112. Here, semiconductor substrate 112 is biased to a prescribed potential level such as ground potential GND or a negative potential Vbb, for example, though not shown.

As shown in FIG. 3A, external power supply line 102 and internal power supply line 106 are arranged adjacent to each other over a long distance. Therefore, it is possible to arrange the field regions 120 and 122 opposing to and adjacent to each other over a long distance with sufficient width, and hence it is possible to cause a large current (large amount of charges) flow at a high speed from field region 120 to field region 122, so that transitional high voltage surge can be reliably absorbed. Since external power supply line 103 extends over a long distance, it has large parasitic capacitance, and hence even when a transitional high voltage surge is applied, it can absorb the charges and suppress increase in the voltage level (V=q/C), and hence the surge immunity of the external power supply line 102 can be improved. This also applies to the internal power supply line 106. Field region 120 can also have sufficient width and hence sufficient junction capacitance, so that increase in the voltage level of field region 120 can be suppressed even when transitional high voltage surge is applied. Thus destruction of the junction formed between field region 120 and semiconductor substrate 112 at the time of surge application can be prevented, and hence surged immunity is improved.

In the first embodiment, in a region where external power supply line 102 and the ground line 104 are arranged parallel to and adjacent to each other, an input protection circuit similar to the prior art example may be additionally provided.

As described above, according to the first embodiment of the present invention, the external power supply line and the internal power supply line are adapted to be electrically connected when a transitional high voltage is applied to the external power supply line. The external power supply line and the input power supply line are arranged parallel to each other over a long distance, a field region having sufficient width can be formed easily, and hence an input protection circuit which has superior surge immunity and capable of absorbing transitional high voltage surge without fail can be obtained.

[Second Embodiment]

Figure 4A:
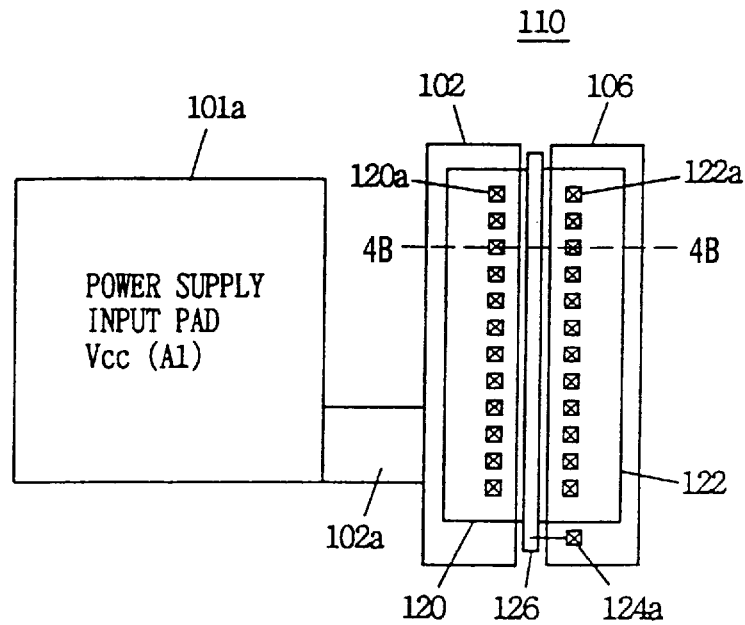
FIG. 4A shows a planar layout of a second embodiment, and FIG. 4B schematically shows a cross sectional structure taken along the line 4B—4B of FIG. 4A.
Figure 4B:
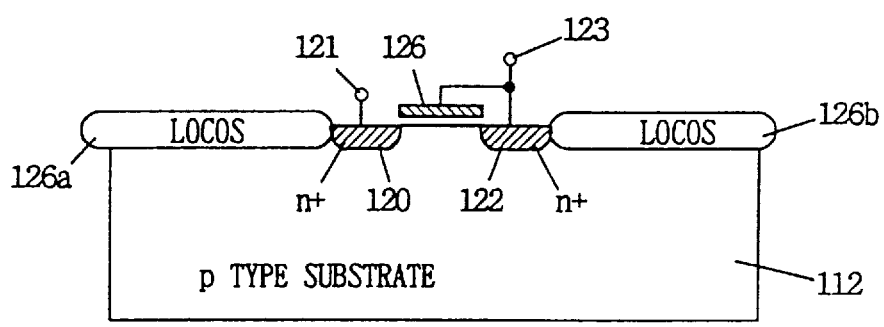

FIGS. 4A and 4B show a planar layout and a cross sectional structure of the input protection circuit portion in accordance with the second embodiment of the present invention. Referring to FIG. 4A, high voltage conduction mechanism 110 includes a field region 120 formed below and parallel to external power supply line 102; a field region 122 formed below and parallel to internal power supply line 106 which is arranged adjacent to and parallel to the external power supply line 102; and a gate electrode layer 126 formed between field regions 120 and 122 by, for example, a first level polycrystalline silicon layer. Gate electrode layer 126 is connected to internal power supply line 106 through a via hole 124a. The distance between field regions 120 and 122 is set to be at most about 3 μm. This is the same in the following embodiments.

Field regions 120 and 122 are connected to external power supply line 102 and internal power supply line 106 through contact holes (or via holes) 120a and 122a, respectively. Therefore, gate electrode layer 120 is electrically connected to field region 122 through via hole 124a, internal power supply line 106 and contact hole 122a.

FIG. 4B shows a cross sectional structure taken along the line 4B—4B shown in FIG. 4A. Referring to FIG. 4B, similar to the first embodiment, field regions 120 and 122 are formed spaced apart from each other by highly doped n type impurity regions at the surface of p type semiconductor substrate 112. On the surface of the semiconductor substrate 112 between field regions 120 and 122, gate electrode layer 126 is formed with a gate insulating film (not shown) interposed. Gate electrode layer 126 is connected to the second node 123. Except this point, the structure is the same as the first embodiment, and corresponding portions are denoted by the same reference characters.

In the structure shown in FIGS. 4A and 4B also, when there is generated a transitional high voltage surge at the first node, punch through is generated in the short channel region below gate electrode layer 126, field regions 120 and 122 are electrically connected, and the high voltage surge is transmitted to field region 122 through field region 120 and substrate region 112, and then to internal power supply line 106 through first node 121, and is absorbed there. If the transitional high voltage surge applied to the first node 121 is high, there is also a breakthrough of n+/p junction formed by field region 120 and semiconductor substrate 112, and as in the first embodiment, absorbed by the semiconductor substrate 112 biased to a prescribed potential level.

As shown in FIGS. 4A and 4B, even when a short channel common MOS transistor (of which gate insulating film should be made relatively thick to maintain breakdown characteristic) is used as the high voltage conducting mechanism, as in the first embodiment, the transitional high voltage surge generated at the first node is absorbed through the second node 123 by internal power supply line 106 because of conduction (punch through caused by expansion of a depletion layer) of the parasitic bipolar transistor. Since the sufficiently wide width of the MOS transistor can be ensured, an input protection circuit having superior surge immunity and capable of absorbing transitional high voltage surge at high speed can be implemented. Similar effect can be obtained even when field regions 120 and 122 are p+ regions, substrate 112 is an n type substrate (Vcc bias) and the gate is connected to node 121.

[First Modification]

Figure 5:
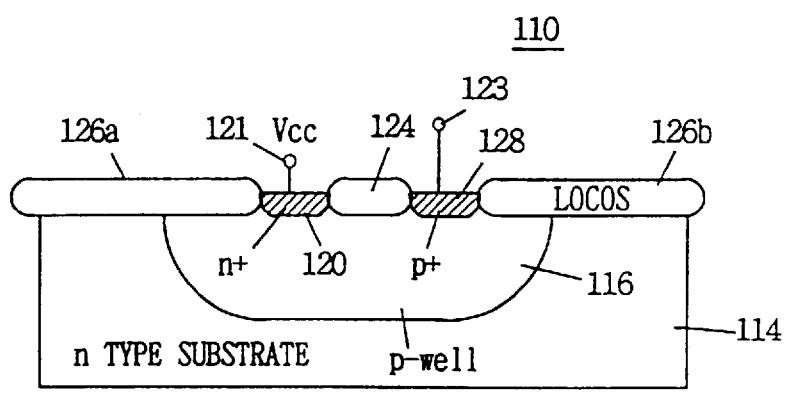
FIG. 5 shows a structure of a first modification of the second embodiment of the present invention.

FIG. 5 shows a structure of a first modification of the second embodiment in accordance with the present invention. Referring to FIG. 5, high voltage conducting mechanism 110 includes an island-shaped impurity region (hereinafter referred to as a well region) 116 having low impurity concentration formed at the surface of an n type semiconductor substrate 114; a field region 120 formed of a highly doped n type impurity region at the surface of well region 116; a field region 128 formed of a highly doped p type impurity region; and a field insulating film 124 formed between field regions 120 and 128. Outside the field regions 120 and 128, LOCOS oxide films 126a and 126b are formed. Field region 120 is connected to a first node 121, and field region 128 is connected to a second node 123.

In the structure shown in FIG. 5, when a transitional high voltage surge is applied to the first node, there is generated a breakthrough at n+/p junction between field region 120 and well region 116, current flows from field region 120 into well region 116, and the current which has flown to well region 116 is transmitted to second node 123 through field region 128. The second node 123 is connected to internal power supply line 106, and the transitional high voltage surge at the first node 121 is absorbed by the internal power supply line 106.

At this time, by field region 120, well region 116 and semiconductor substrate 114, a vertical npn parasitic bipolar transistor is formed. When the potential at well region 116 rises, the parasitic bipolar transistor is rendered conductive, and current flows from field region 120 through well region 116 to semiconductor substrate 114. Consequently, even when the transitional high voltage surge is high, the surge can be surely absorbed. Though a planar layout of the high voltage conductive mechanism is shown in FIG. 5, field regions 120 and 128 are formed to have sufficient width in parallel to the external power supply line and the internal power supply line, respectively.

[Second Modification]

Figure 6:
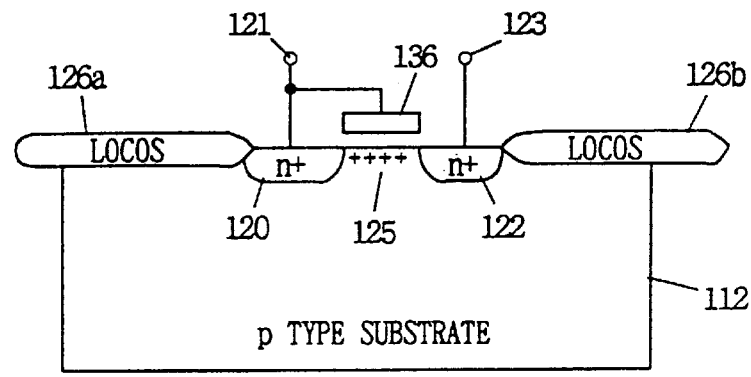
FIG. 6 shows a structure of a second modification of the second embodiment of the present invention.

FIG. 6 shows a structure of a second modification of the second embodiment in accordance with the present invention. Referring to the structure of FIG. 6, p type impurity is introduced to a high concentration, in the channel region 125 at the surface of p type semiconductor substrate 112 between field regions 120 and 122. On channel region 125, gate electrode layer 136 is formed with sufficiently thick gate insulating film, not shown, interposed, and the gate electrode layer 136 is connected to the first node 121.

By introducing p type impurity ions to a high concentration in the channel region 125, the threshold voltage of the MOS transistor can be set sufficiently high in cooperation with the effect of the thick gate insulating film. When a transitional high voltage surge is generated at the first node 121 and potential difference between first and second nodes 121 and 123 become higher than the threshold voltage of the MOS transistor, the MOS transistor is rendered conductive, current flows from the first node 121 to the second node 123, charges are transmitted through the second node 123 to the internal power supply line 106, and surge is absorbed. By using an MOS transistor having sufficiently high threshold voltage such as shown in FIG. 6, similar effects can be obtained.

In channel region 125, a field insulating film 124 shown in FIG. 5 may be formed, in place of the insulating film shown. In the structure shown in FIG. 6 also, when there is generated a transitional high voltage surge at the first node and there is a breakthrough at n+/p between field region 120 and semiconductor substrate 112, current flows from field region 120 to semiconductor substrate 112, and similarly, the surge is absorbed by the semiconductor substrate 112.

As described above, according to the second embodiment of the present invention, input protection mechanism is provided by an MOS transistor or an n+/p junction instead of a field transistor. Therefore, when a transitional high voltage surge is generated, the transitional high voltage surge can be absorbed by punch through phenomenon (on state of a parasitic bipolar transistor) of the MOS transistor or breakthrough at n/p junction, and hence internal circuit can be surely protected.

[Third Embodiment]

Figure 7A:
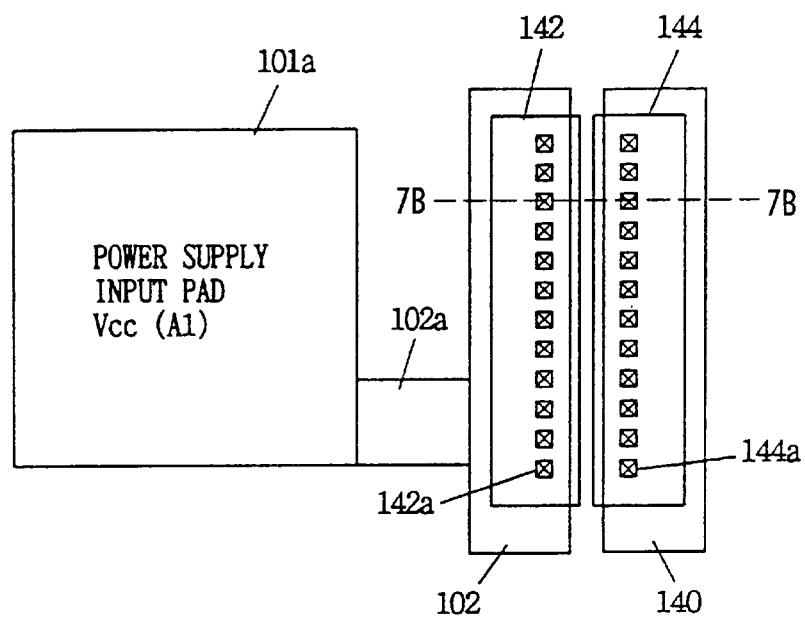
FIG. 7A is a planar layout of an input protection circuit in accordance with a third embodiment of the present invention, and FIG. 7B schematically shows a cross sectional structure taken along the line 7B—7B of FIG. 7A.
Figure 7B:
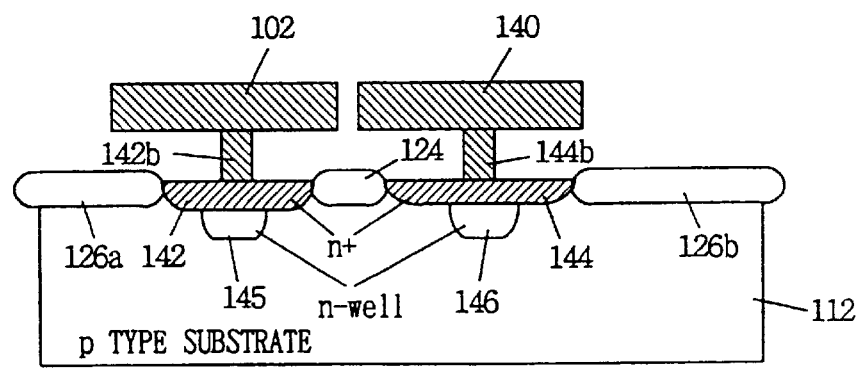

FIG. 7A is a planar layout of the input protection circuit in accordance with a third embodiment of the present invention, and FIG. 7B shows a cross sectional structure taken along the line 7B—7B of FIG. 7A.

Referring to FIG. 7A, the high voltage conducting mechanism includes an external power supply line 102 connected to power supply input pad 101a through conductive line 102a, a conductive line 140 arranged parallel to and spaced apart from external power supply line 102, for transmitting a prescribed potential, a field region 142 connected to external power supply line 102 through a contact hole 142a, and a field region 144 connected to conductive line 140 through a contact hole 144a. Field regions 142 and 144 are formed parallel to and below external power supply line 102 and conductive line 140, respectively.

Field regions 142 and 144 are formed to have sufficient widths, respectively.

Referring to FIG. 7B, field regions 142 and 144 are provided formed by highly doped n type impurity regions. Field region 142 is connected to external power supply line 102 through a contact 142b formed at contact hole 142a. At a portion below the contact portion between field region 142 and the contact, an n type impurity region of low impurity concentration (hereinafter referred to as a lower well) 145 is formed at outside of and in contact with the field region 142. Field region 144 is connected to conductive line 140 through a contact 144b formed at a contact hole 144a. At a lower portion under the contact portion of field region 144 and contact 144b, a lower well 146 is formed at outside of and in contact with field region 144. Lower wells 145 and 146 as well as field regions 142 and 144 are formed at the surface of p type semiconductor substrate 112.

Conductive line 140 may be the internal power supply line in accordance with the first or second embodiment, or it may be an external power supply line of a different route, if any such external power supply line of a different route or rail is provided. Alternatively, the conductive line 140 may be a ground line transmitting the ground potential.

When there is generated a transitional high voltage surge at external power supply line 102, a large current flows to field region 142 through contact 142b. When the potential at field region 142 increases by the large current, a high electric field is generated between field region 142 and substrate 112. However, by the provision of a lower well 145, gradient of the impurity concentration between field region 142 and substrate 112 becomes moderate. Therefore, at a portion where a high electric field is likely to occur, depletion layer can be prevented from being narrowed by the impurity concentration gradient, application of a high electric field across the p/n+ junction interface can be prevented, and hence junction breakdown characteristic can be improved. Consequently, junction breakdown at the time of surge application can be prevented.

Even when a large current flows to contact 142b and metal constituting the contact 142b is melt and diffused into field region 142, the melt metal diffuses to lower well 145 at most, and hence short circuit between contact 142b and substrate 112 by the melt metal can be prevented (penetration can be prevented). Therefore, junction breakdown at the field region 142 when a surge is generated can be prevented, and hence surge immunity can be improved.

Further, when a surge is generated and a large current flows from field region 142 through substrate 112, it is possible that a large current flows to field region 144 and high electric filed is generated similarly. However, as the lower well 146 is provided, generation of the high electric field in the field region 144 can be suppressed, and even when contact 144b is melt by the large current, diffusion of the melt metal can be stopped within the lower well 146. Therefore, short circuit between contact 144 and substrate 112 can be prevented.

When abrupt current due to the surge rushes into field region 144 from field region 142 and a high electric field is generated under the contact 144b, the high electric field is relaxed by the lower well 146.

Further, by providing lower well 146 for conductive line 140, when the conductive line 140 is operational power supply line or a ground line of a different route, a transitional high voltage surge generated in the conductive line 140 can be stably absorbed by the external power supply line 102, and therefore, no matter whether the transitional high voltage surge is generated at the external power supply line 102 or conductive line 140, the surge can be surely absorbed.

[First Modification]

Figure 8:
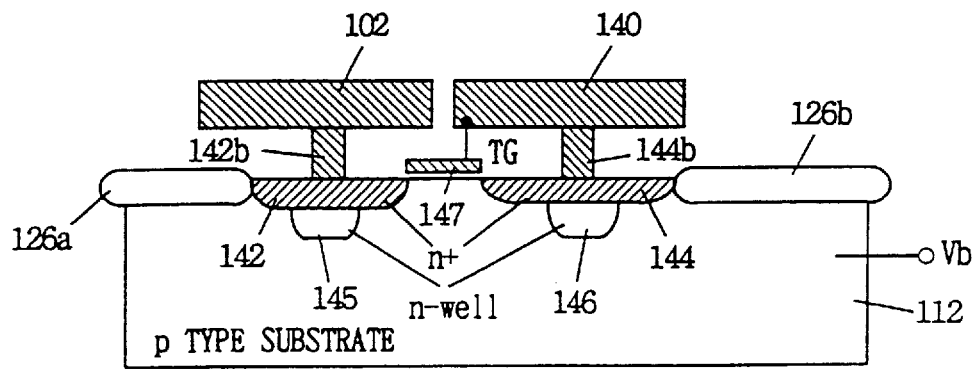
FIG. 8 schematically shows a structure of a first modification of the third embodiment of the present invention.

FIG. 8 shows the structure of a first modification of the third embodiment of the present invention. In the structure shown in FIG. 8, an MOS transistor is used in place of a field transistor. More specifically, at a surface of semiconductor substrate 112 between field regions 142 and 144, a gate electrode layer 147 is formed with a gate insulating film (not shown) interposed. Gate electrode layer 147 is connected to conductive line 140. Except this point, the structure is the same as that shown in FIG. 7B, and corresponding portions are denoted by the same reference characters.

In the structure shown in FIG. 8, when a transitional high voltage surge is generated at internal power supply line 102 and a large current flows through contact hole 142b, diffusion of the melt metal of contact 142b to the semiconductor substrate 112 can be prevented, and electric field concentrated at the junction interface of field region 142 can be relaxed. Therefore, junction breakdown can be prevented. Namely, in the structure shown in FIG. 8 also, surge can be stably absorbed as in the structure shown in FIG. 7B.

In the structure shown in FIG. 8, lower well 145 may be formed extending below gate electrode layer 147, namely, it may have a similar structure as a so called LDD (Lightly Doped Drain) structure. This also applies to field region 142.

[Second Modification]

Figure 9:
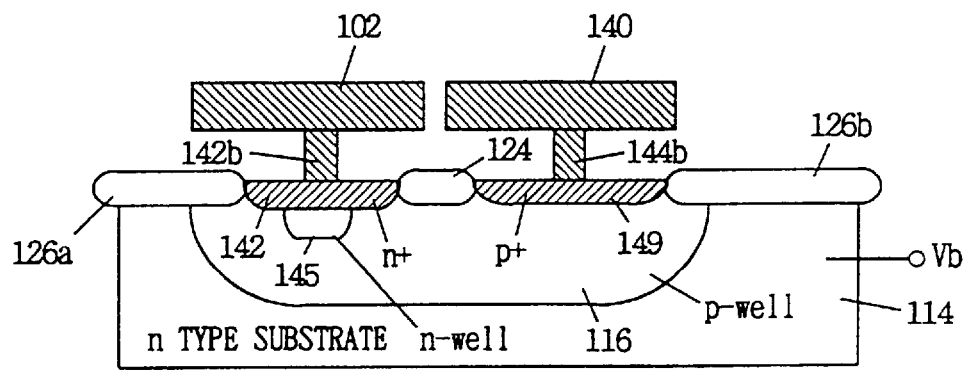
FIG. 9 schematically shows a structure of a second modification of the third embodiment of the present invention.

FIG. 9 shows a structure of a second modification of the third embodiment of the present invention. In the structure shown in FIG. 9, a p type well region 116 having low impurity concentration is formed at a surface of an n type semiconductor substrate 114. At the surface of p well 116, a field region 142 formed by a highly doped n type impurity region and a field region 149 formed of a highly doped p type impurity region are formed spaced from each other. Field region 142 is connected to external power supply line 102 through contact 142b, and field region 149 is connected to conductive line 140 through contact 144b. At the surface of well 116 between field regions 142 and 149, a field insulating film 124 is formed. In the structure shown in FIG. 9, the high voltage surge generated at external power supply line 102 is absorbed by conductive line 140, utilizing a p/n junction diode.

Field region 149 is electrically connected to well region 116, and hence no high electric field is applied across the junction (p+/p junction) between well region 116 and field region 149. Therefore, in the field region 149, lower well is not provided. Meanwhile, in field region 142, as the field region 142 is formed by an n type impurity region, high electric field concentration at the n+/p junction interface generated when a high voltage surge is experienced by the external power supply line 102 is relaxed by lower well 145. Further, diffusion of melt metal of contact hole 142b to well 116 is prevented by lower well 145, so that metal penetration into field region 142 is prevented. Therefore, the transitional high voltage surge generated at the external power supply line 102 can be stably absorbed.

In the structure shown in FIG. 9, by the provision of lower well 145, the distance between lower well 145 and n type semiconductor substrate 114 becomes shorter. Therefore, length of a base region of a vertical parasitic bipolar transistor in which field region 142 and lower well 145 serves as a collector, p well region 115 serves as a base and n type semiconductor substrate 114 serves an emitter is made shorter, and current amplification rate of the vertical parasitic bipolar transistor is made higher. Therefore, when current flows from field region 142 to well region 116, the parasitic bipolar transistor is turned on at high speed, causing a current to flow from well region 116 to semiconductor substrate 114. Therefore, the surge can be absorbed both by the conductive line 140 and by semiconductor substrate 114, and therefore, the transitional high voltage surge can be absorbed surely at high speed.

[Third Modification]

Figure 10:
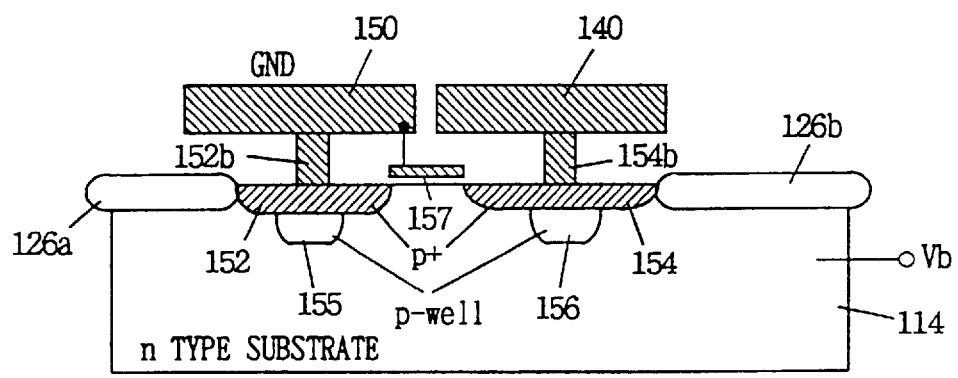
FIG. 10 schematically shows a structure of a third modification of the third embodiment of the present invention.

FIG. 10 shows a structure of a third modification of the third embodiment in accordance with the present invention. Referring to FIG. 10, there are field regions 152 and 154 provided by highly doped p type impurity regions at the surface of n type semiconductor substrate 114. Field regions 152 and 154 are connected to ground line 150 and conductive line 140 through contacts 152b and 154b, respectively. Below a contact portion between contact 152b and field region 152, a p type impurity region (lower well) 155 having low impurity concentration is formed, and below a contact portion between contact 154b and field region 154b, lower well 156 is formed in contact with field region 154. At the surface of semiconductor substrate 114 between field regions 152 and 154, a gate electrode layer 157 is formed with a gate insulating film, not shown, interposed. Gate electrode layer 157 is connected to ground line 150. The p type substrate 114 is biased to a bias potential Vb which is approximately at the same voltage level as the voltage transmitted to conductive line 140.

In the structure shown in FIG. 10, when a negative high voltage surge is generated at ground line 150, the junction between field region 150 and semiconductor substrate 114 is broken through, and hence a current flows from substrate 114 through field region 152 and contact 152b to the ground line 150. At this time, there is a punch through between field regions 152 and 154 (lateral parasitic bipolar transistor is turned on), and hence current is supplied from conductive line 140 to field region 152 through field region 124. Therefore, the negative high voltage surge generated at ground line 150 can be absorbed.

In the structure shown in FIG. 10 too, even when a large current flows and the contact is melt, diffusion of the melt metal into the semiconductor substrate 114 can be prevented, and hence junction breakdown can be surely prevented. Further, since lower well is provided at region where a large current is likely to flow, that is, the region where generation of high electric field is likely to generate, the high electric filed can be relaxed by the lower wells 155 and 156 even when a large current is generated. Therefore, junction breakdown of field regions 152 and 154 can be prevented.

In the structure shown in FIG. 10 also, lower wells 155 and 156 may be formed extending to portions below the gate electrode layer 157.

As described above, according to the third embodiment, since a well region (impurity region) having a low impurity concentration is provided below a contact of the field region connected to the power supply line through the contact, even when a large current is generated by a transitional high voltage surge, junction breakdown of the field region can be prevented, and hence an input protection circuit having a superior surge immunity can be obtained.

[Fourth Embodiment]

Figure 11A:
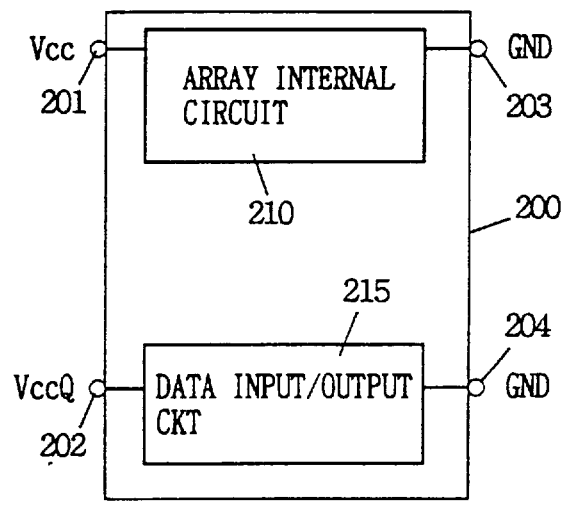
FIG. 11A schematically shows a whole structure of a semiconductor memory device in accordance with a fourth embodiment of the present invention.
Figure 11B:
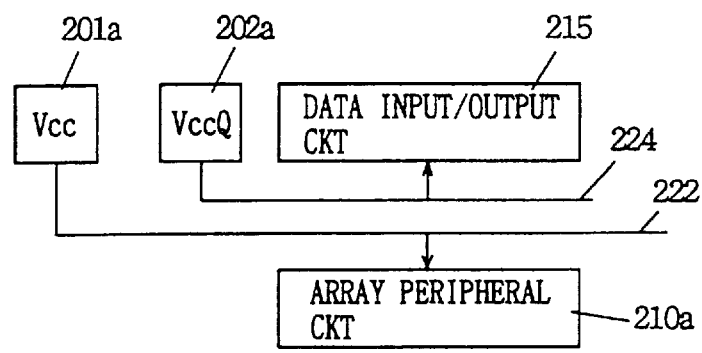
FIG. 11B shows a layout of power supply lines in the arrangement in FIG. 11A.

FIGS. 11A and 11B schematically show the structure of a semiconductor device in accordance with the fourth embodiment of the present invention.

Referring to FIG. 11A, a semiconductor device 200 includes array internal circuitry 210 including a memory cell array and a peripheral circuit, and a data input/output circuit 215 for communicating data processed by array internal circuitry 1210 with the outside.

For the array internal circuitry 210, dedicated external power supply terminal 201 and ground terminal 203 are provided. For data input/output circuit 215, dedicated external power supply terminal 202 and ground terminal 204 are provided. The power supply potential of the external power supply terminal 202 will be referred to as external power supply potential VccQ so as to indicate that it is used for data input/output.

Since power source lines (including both the power supply lines and ground lines) are provided separately for the array internal circuitry 210 and data input/output circuit 215, influence of fluctuation (power supply bump) of the power supply potential caused when data input/output circuit 215 consuming large power is in operation on the operation of the array internal circuitry 210 can be prevented, so that the array internal circuitry 210 operates stably. Further, power supply potential VccQ and a ground potential GND can be supplied stably to the data input/output circuit 215.

FIG. 11B shows an arrangement of power supply pad in a semiconductor device. FIG. 11B shows, as an example, a pad arrangement of a so called LOC (Lead On Chip) structure. A pad 201a receiving external power supply potential Vcc and a power supply pad 202b receiving external power supply potential VccQ are shown arranged adjacent to each other. Power supply line 222 extends from power supply pad 201a, and power supply potential is supplied to array peripheral circuitry 210a such as sense amplifiers and decoders included in the array internal circuitry 210. Meanwhile, for power supply pad 202a, power supply line 224 is arranged parallel to power supply line 222, supplying power supply potential VccQ to data input/output circuit 215. Ground line is not shown in FIG. 11B. Internal power supply potential Vint may be supplied from pad 201a through an internal down converting circuit onto power supply line 222, or external power supply potential Vcc may be directly supplied to power supply line 222 (when the internal down converting circuit is not provided).

As shown in FIG. 11B, even in such an arrangement in that power supply lines 222 and 224 are provided separately, power supply lines 222 and 224 are arranged parallel to each other over a long distance. Therefore, an input protection circuit having sufficient layout area can be easily formed by using the power supply lines 222 and 224, as shown in FIG. 12.

Figure 12:
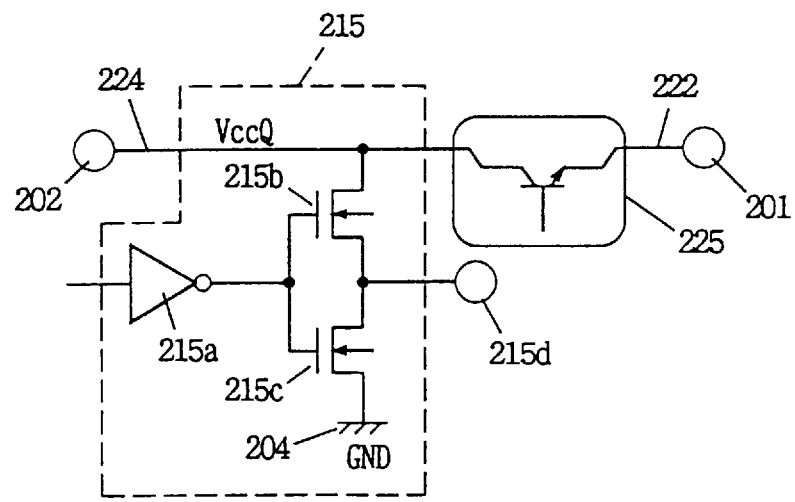
FIG. 12 specifically shows a structure of the input protection circuit in accordance with the third embodiment of the present invention.

Referring to FIG. 12, an input protection circuit (high voltage conducting mechanism) 225 is provided between power supply line 22 and external power supply line 224 transmitting external power supply potential VccQ to data input/output circuit 215. Power supply line 222 is electrically coupled to external power supply terminal 201.

Referring to FIG. 12, data input/output circuit 215 receives and utilizes at its data output portion, the external power supply potential VccQ. This is because the data output portion consumes current most, in order to drive a large load at high speed. Data input/output circuit 215 includes an internal circuit 215a (which may have level converting function) for amplifying data read from the inside; an n channel MOS transistor 215b connected between power supply line 224 and data output terminal 215d and receiving at its gate an output signal from inverter circuit 215a; and an n channel MOS transistor 215c connected between data output terminal 215d and ground terminal (ground line, ground node) 204 and receiving at its gate the output signal from inverter circuit 215a. Therefore, at data output terminal 215d, data at the level of the power supply potential VccQ or at the level of the ground potential GND is output. By adapting the amplitude of the data signal appearing at the data output terminals 215d to be the level of the external power supply potential VccQ (=Vcc), compatibility with an external device is maintained.

Input protection circuit 225 is shown as constituted by a parasitic npn bipolar transistor in FIG. 12. When a transitional high voltage surge is generated at power supply line 224, the bipolar transistor included in the input protection circuit 225 is rendered conductive, discharging current (charges) caused by the transitional high voltage surge to power supply line 222, and the high voltage surge is absorbed by power supply line 222. A number of circuits are connected to power supply line 222, power supply line 222 has large stray capacitance, and hence it can absorb charges caused by the transitional high voltage surge stably.

Figure 13A:
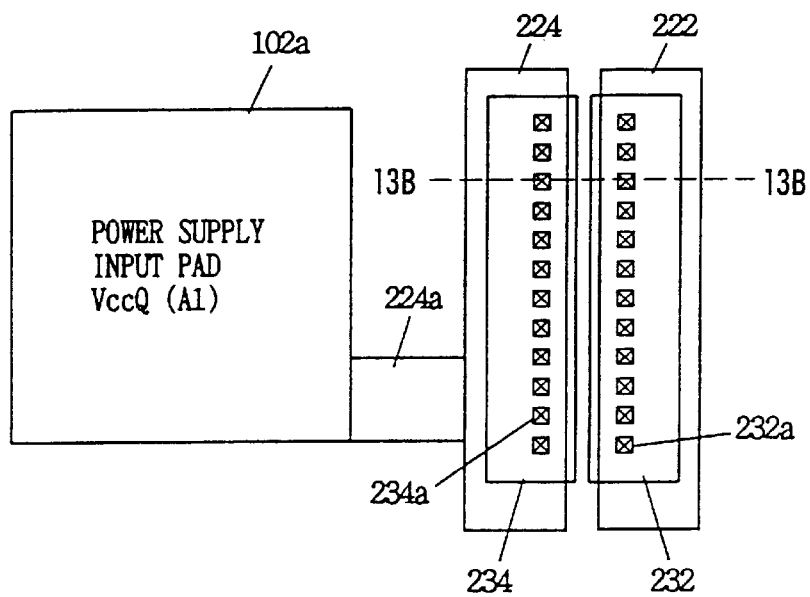
FIGS. 13A and 13B schematically show planar layout and cross sectional structure of a high voltage conducting mechanism shown in FIG. 12.
Figure 13B:
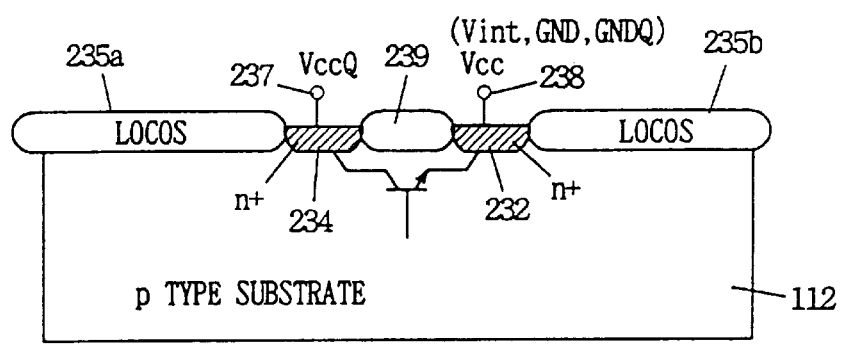

FIGS. 13A and 13B show a planar layout and a cross sectional structure of input protection circuit shown in FIG. 12, respectively. Referring to FIG. 13A, power supply input pad 202a receiving external power supply potential VccQ is connected through conductive line 224a to power supply line 224. Another power supply line 222 is arranged adjacent to and parallel to power supply line 224. A field region 224 is formed below and parallel to power supply line 224, and a field region 232 is formed below and parallel to power supply line 222. Field regions 232 and 234 are connected to power supply lines 222 and 224 to contact holes 232a and 234a, respectively. Since power supply lines 220 and 224 are arranged parallel to each other over a relatively long distance, a portion where a field regions 232 and 234 oppose to each other can be made sufficiently long. Thus, as in the first to third embodiments above, an input protection circuit having superior surge immunity and capable of absorbing surge current at high speed can be provided.

FIG. 13B schematically shows a cross sectional structure taken along the line 13B—13B of FIG. 13A. Field region 232 is constituted by a highly doped n type impurity region, and field region 234 is constituted by a highly doped n type impurity region. Field regions 232 and 234 are formed at a surface of a p type semiconductor substrate 112. At the surface of the substrate 112 between field regions 232 and 234, a field insulating film 239 is formed. Field region 234 is connected to a first node 237, and field region 233 is connected to a second node 238. Power supply potentials VccQ and Vcc are applied to nodes 237 and 238, respectively. The structure of the input protection circuit shown in FIGS. 13A and 13B is the same as the high voltage conduction mechanism shown with respect to the first to third embodiments above. When a transitional high voltage surge higher than the voltage level applied during normal operation of the power supply potential VccQ is applied to the first node 237, parasitic npn bipolar transistor constituted by field region 234, semiconductor substrate 112 and field region 232 is rendered conductive (there is a punch through between field region 234 and 232, and there is a breakthrough of junction at field region 234), the high voltage surge is transmitted through field region 232 to the second node 238, and to substrate 112, and thus the high voltage surge is absorbed.

The power supply line 222 may not be the power supply line to which the external power supply potential Vcc is transmitted, and it may be an internal power supply line to which internal power supply potential Vint is transmitted.

Alternatively, it may be a ground line to which the ground potential GND (GNDQ for the output circuit) is transmitted.

Figure 14:
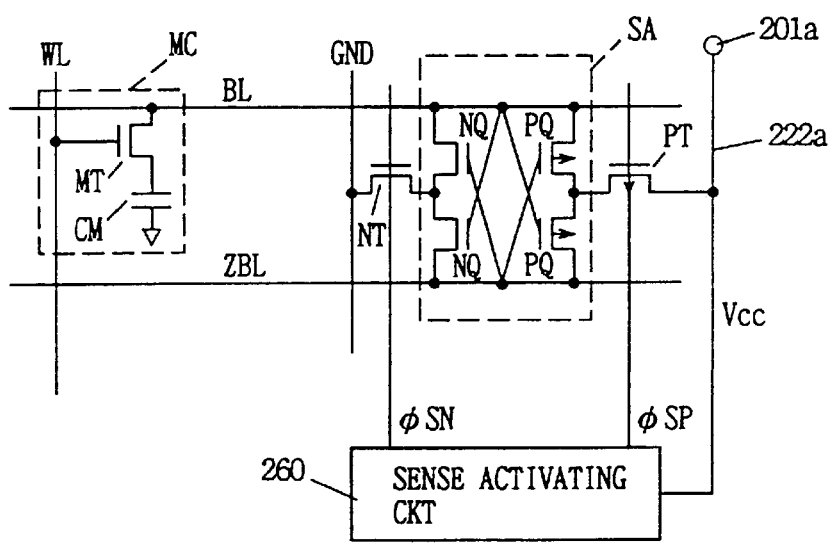
FIG. 14 shows a structure of a modification of the third embodiment of the present invention.

FIG. 14 shows a specific example of the structure of the array peripheral circuitry 210a shown in FIG. 11B. Referring to FIG. 14, the array peripheral circuitry includes a sense amplifier SA provided for a bit line pair BL and ZBL, for differentially amplifying the potential at bit lines BL and ZBL; and a sense activating circuit 260 which operates using the external power supply potential Vcc on power supply line 222 as one operational power supply potential, for outputting sense activating signals φSP and φSN for activating the sense amplifier SA. A word line WL is arranged in a direction crossing the paired bit lines BL and ZBL. A memory cell MC is arranged at a crossing between word line WL and the paired bit lines BL and ZBL. In FIG. 14, a memory cell MC arranged at a crossing between bit line BL and word line WL is shown as a representative. Memory cells MC are arranged in a matrix of rows and columns, word lines WL are arranged corresponding to the rows of the memory cells, and bit line pairs BL and ZBL are arranged corresponding to the columns of the memory cells, respectively. A memory cell MC includes a capacitor CM storing information, and an access transistor MT which is rendered conductive in response to a signal potential on word line WL for electrically connecting the capacitor CM to the bit line BL.

Sense amplifier SA includes a pair of n channel MOS transistors NQ cross coupled between the paired bit lines BL and ZBL; and a pair of p channel MOS transistors PQ cross coupled between the paired bit lines BL and ZBL. For the sense amplifier SA, there are provided an activating transistor PT which is rendered conductive in response to sense activating signal φSP from sense amplifying circuit 260 for transmitting the power supply potential Vcc on power supply line 222a to a connecting portion of p channel MOS transistors PQ; and an activating transistor NT which is rendered conductive in response to sense activating signal φSN from sense activating circuit 260 for transmitting a ground potential GND to the connection portion of the pair of n channel MOS transistors. The power supply line 222a is connected to node 201a. Node 201a may be a power supply pad, or it may an external pin terminal.

In the structure shown in FIG. 14, when the sense amplifier SA is activated, that is, when activating transistors PT and NT are rendered conductive, p channel MOS transistors PQ raise the potential of one of the bit lines BL and ZBL which is at a higher potential to the level of the power supply potential Vcc, while n channel MOS transistors NQ discharge the other one of the bit lines which has lower potential to the level of the ground potential GND. In the structure shown in FIG. 14, the potential amplitude between the bit lines BL and ZBL is set to the level of the power supply potential Vcc. Therefore, in the semiconductor device shown in FIG. 14, an internal down converting circuit is not provided, and the power supply potential externally applied is utilized as the internal operational power supply potential. Sense amplifier SA is provided for each of the paired bit lines BL and ZBL. Therefore, when the sense amplifier SA is in operation, a large number of bit lines BL and ZBL are charged/discharged. Therefore, current consumption by power supply line 222a is considerably large. By supplying power supply potential from the power supply line 222a through node 201a from a dedicated power supply pin terminal, sensing operation becomes stable. In this case, since a large number of sense amplifiers are to be driven, the width and parasitic capacitance of power supply line 222a are large, and hence even when it is used as a power supply line for absorbing surge, the transitional high voltage surge can be stably absorbed.

As described above, in accordance with the fourth embodiment of the present invention, since a high voltage conducting mechanism is provided between an external power supply line and a conductive line to which a different constant potential is supplied, the power supply line and the conductive line are arranged parallel to each other over a long distance, and hence necessary and sufficient area for arranging the high voltage conducting mechanism can easily be ensured. Therefore, an input protection circuit for absorbing surge can be surely implemented without increasing occupational area at all.

[Fifth Embodiment]

Figure 15A:
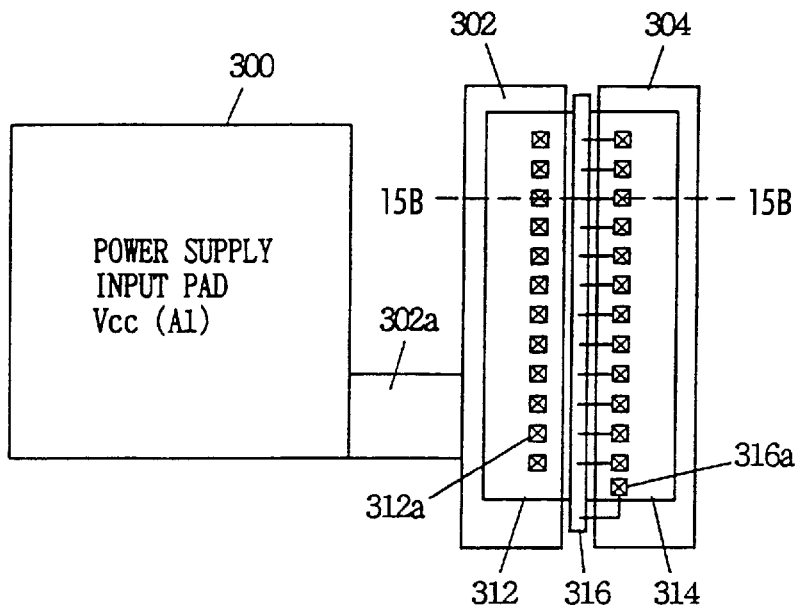
FIG. 15A shows a planar layout of the input protection circuit in accordance with a fourth embodiment of the present invention, and FIG. 15B schematically shows a cross sectional structure taken along the line 15B—15B of FIG. 15A.
Figure 15B:
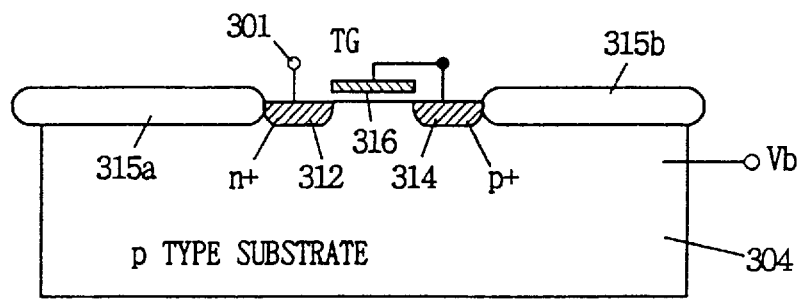

FIGS. 15A and 15B respectively show a planar layout and a cross sectional structure of an input protection circuit portions in accordance with the fifth embodiment of the present invention. Referring to FIG. 15A, the high voltage conducting mechanism includes a power supply line 302 connected to a power supply input pad 300 through a conductive line 302a; a field region 312 formed below and parallel to power supply line 302; and a field region 314 arranged parallel to field region 312. Field region 314 is electrically connected to semiconductor substrate 304. Field region 312 is electrically connected to power supply line 302 through contact hole 312a, and field region 314 is connected to gate electrode layer 316 through contact hole 316a. Gate electrode layer 316 is arranged in a region between field regions 312 and 314, parallel to field regions 312 and 314 and lower than power supply lines 302 and 304.

FIG. 15B shows a cross sectional structure taken along the line 15B—15B of FIG. 15. Referring to FIG. 15B, at a surface of a p type semiconductor substrate 304, field region 312 constituted by a highly doped n type impurity region and field region 314 constituted by a highly doped p type impurity region are arranged. At a surface of substrate 304 between field regions 312 and 314, gate electrode layer 316 is arranged with a gate insulating film, not shown, interposed. Gate electrode layer 316 is electrically connected to field region 314. Field region 314 and semiconductor substrate 304 are of the same conductivity type, field region 314 has a higher impurity concentration than semiconductor substrate 304 has, and it is electrically connected to semiconductor substrate 304. Field region 312 is electrically connected to the first node 301. The first node 301 may be a power supply input pad 300 or an external power supply terminal. Alternatively, it may be an arbitrary portion of power supply line 302 or a conductive line 302a. Semiconductor substrate 304 receives a prescribed bias potential (ground potential or negative potential) Vb.

When a transitional high voltage surge is generated at the first node 301, n+/p junction of field region 312 experiences through, and charges flow along the surface of substrate surface 304 from field region 312 to field region 314, and the charges which have reached the field region 314 are absorbed by semiconductor substrate 304. When the high voltage surge applied to the first node 301 is large, there will be a breakdown of the junction between field region 312 and semiconductor substrate 304 like zener breakdown, and current directly flows from field region 312 to substrate 304.

In the structure shown in FIGS. 15A and 15B, the high voltage conducting mechanism utilizes the semiconductor substrate as the second node. Therefore, even when there is not a conduction line (ground line, internal power supply line or reference power supply line) arranged parallel to power supply line 302, a high voltage conducting mechanism having sufficient width can be implemented by forming field region 314 at the surface of semiconductor substrate 304 parallel to field region 312 formed below power supply line 302. Therefore, even when a necessary line is not provided, a high voltage conducting mechanism having necessary area can be readily implemented.

Since semiconductor substrate 304 has sufficiently large capacitance, the high voltage surge can be stably absorbed. Further, as the power supply line 302 can have any shape (since there is not a conductive line connected to the second node), it is possible to ensure sufficient length in the width direction of field region 312, and hence it is possible to sufficiently enlarge stray capacitance of power supply line 302. Therefore, an input protection circuit having superior surge immunity can be implemented.

[Modification]

Figure 16:
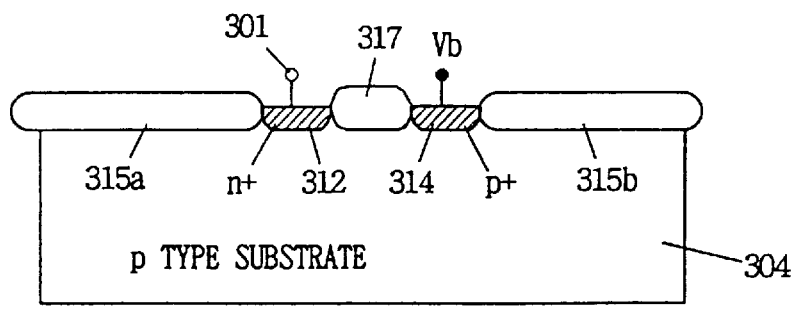
FIG. 16 schematically shows a structure of a modification of a fifth embodiment of the present invention.

FIG. 16 shows a modification of the fifth embodiment of the present invention. In the structure shown in FIG. 16, different from the structure shown in FIG. 15B, a field insulating film 317 is formed at the surface of semiconductor substrate 304 between field regions 312 and 314. Outside the field regions 312 and 314, LOCOS films 315a and 315b are formed. Substrate bias potential Vb (ground potential or negative potential) is applied to field region 314. In the structure shown in FIG. 16 also, when there is generated a transitional high voltage surge at the first node 301, the n+/p/p+ diode constituted by field region 312, semiconductor substrate 304 and field region 314 is rendered conductive, and hence the transitional high voltage surge generated at the first node 301 can be absorbed by the semiconductor substrate 304.

In the fifth embodiment, when the first node 301 is connected to a field region formed of a p type impurity region, the semiconductor substrate is adapted to have n type conductivity and the field region 312 is formed by n type highly doped impurity region, a protection circuit absorbing the high voltage surge can be implemented.

As described above, in accordance with the fifth embodiment of the present invention, the transitional high voltage surge is absorbed by the semiconductor substrate. Therefore, even in a region where the power supply line and a conductive line are not arranged parallel to each other, a high voltage conducting mechanism utilizing a power supply line as one node can be formed utilizing any empty region on the substrate. Therefore, an input protection circuit (high voltage conducting mechanism) having sufficient necessary area can be implemented without increasing the chip area.

[Sixth Embodiment]

Figure 17A:
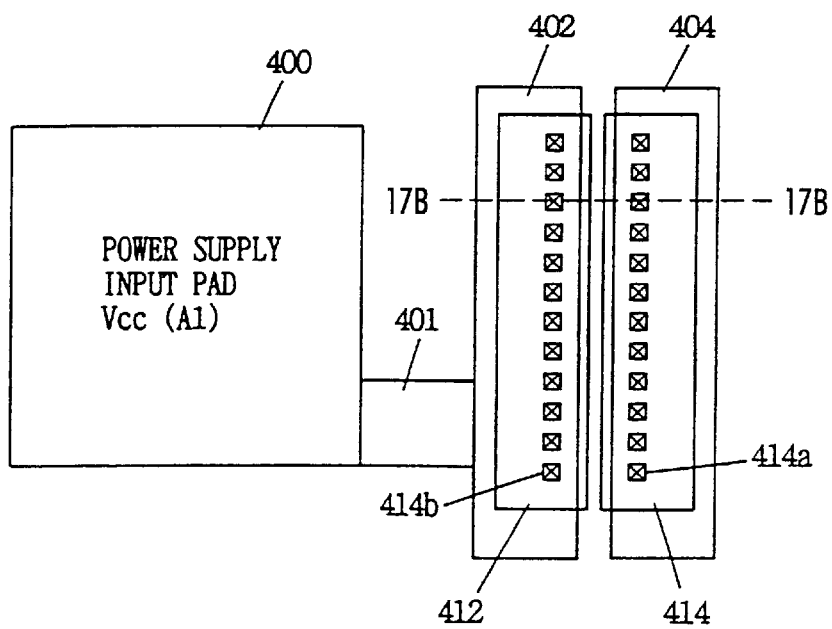
FIG. 17A schematically shows a planar layout of the input protection circuit in accordance with a sixth embodiment of the present invention, and FIG. 17B schematically shows a cross sectional structure taken along the line 17B—17B of FIG. 17A.
Figure 17B:
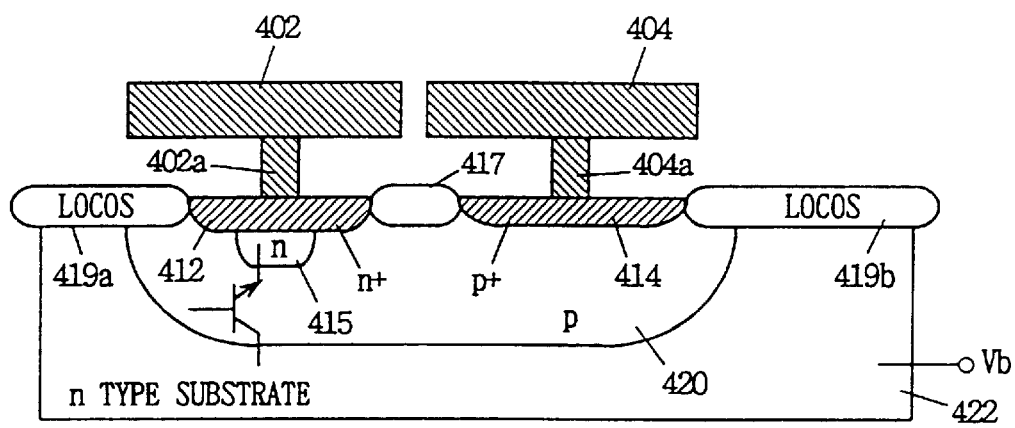

FIG. 17A is a planar layout showing a structure of a main potion of an input protection circuit in accordance with the sixth embodiment of the present invention, and FIG. 17B shows a cross sectional structure taken along the line 17B—17B of FIG. 17A. Regarding to FIG. 17A, the input protection circuit includes a power supply input pad 400 receiving an externally applied power supply potential Vcc; an external power supply line connected to power supply input pad 400 through a conductive line 401 for transmitting the internal power supply potential Vcc to inside; and a conductive line 404 arranged extending parallel to and adjacent to the external power supply line 402. The conductive line 404 may be any of the separately provided external power supply line, the ground line, the internal power supply line and the ground line provided for the data output portion, as in the fourth and fifth embodiments. It may be any line provided that it is a conductive line transmitting the ground potential GND, power supply potential Vcc or Vint as operational power supply potential.

The high voltage conducting mechanism includes a field region 412 formed below and parallel to power supply line 402 and connected to power supply line 402 through a contact hole (or a via hole) 414b, and a field region 414 arranged parallel to and below the conductive line 404 and spaced by a small distance (at most about 3 μm) from field region 414. Field region 414 is connected to conductive line 404 through a contact hole (or a via hole) 414a.

Referring to FIG. 17B, field regions 412 and 414 are formed at a well region 420 formed by a lightly doped p type impurity region. At the surface of well region 420 between field regions 412 and 414, a field insulating film 417 is formed. Field region 412 is formed of a highly doped n type impurity region, and field region 414 is formed of a highly doped p type impurity region. Field region 412 is connected to power supply line 402 through a contact 402a formed at contact hole 414b. Field region 141 is connected to conductive line 404 at a contact 404a formed at contact hole 414a. At a portion below a contact portion between field region 412 and contact 402a, a lower well 415 formed by an n type impurity region having a low impurity concentration is formed parallel to the field region 412. Well region 420 is formed at the surface of n type semiconductor substrate 420. Well region 420 is separated from other circuit portions by LOCOS films 419a and 419b. Semiconductor substrate 422 is fixed at a bias potential Vb at the level of the external power supply potential Vcc or the ground potential.

In the structure shown in FIGS. 17A and 17B, when a transitional high voltage surge is generated at power supply line 402, there is generated a breakthrough at the junction between field region 412 and well region 420 (or a punch through between field regions), current flows from field region 412 through well region 420 to field region 414, and the current caused by the high voltage surge is absorbed by the conductive line 404. At this time, a lateral npn bipolar transistor constituted by field region 412, lower well 415, well region 420 and semiconductor substrate 422 is rendered conductive, current flows from the lower well 415 through well region 420 to substrate 422, and the high voltage surge is absorbed by the semiconductor substrate 422.

In FIG. 17B, lower well 415 is shown as constituting the emitter region of the parasitic bipolar transistor. However, the parasitic bipolar transistor is rendered conductive when a transitional high voltage surge is generated, and hence the lower well 415 may form a collector region of the parasitic bipolar transistor. The base region of the parasitic bipolar transistor is provided with the lower well 415. Therefore, the length of the base region is made shorter, current amplification rate is increased, and hence it allows larger amount of current to flow into the semiconductor substrate 422 at a high speed. Therefore, the high voltage surge can be absorbed at high speed.

Referring to FIG. 17B, when the conductivity types shown are reversed, a protection circuit against negative high voltage surge on the ground line instead of the power supply line 202 can be implemented.

[Modification]

Figure 18:
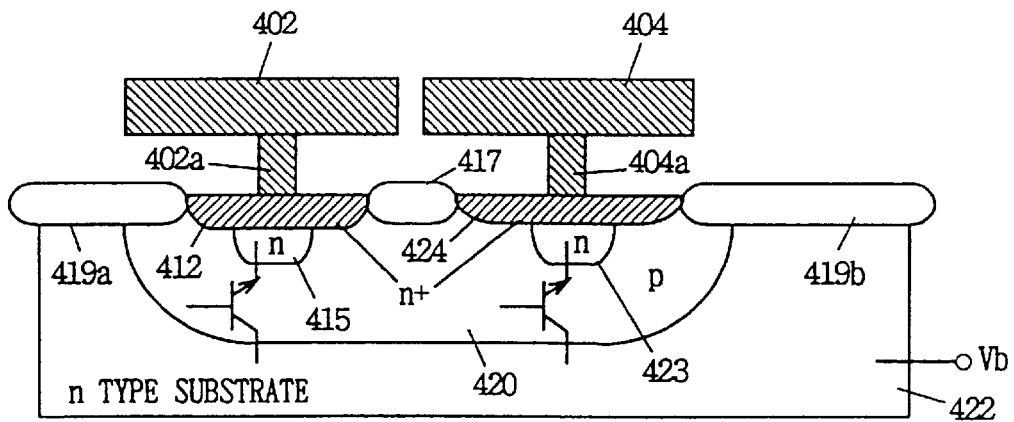
FIG. 18 schematically shows a structure of a modification of the sixth embodiment of the present invention.

FIG. 18 shows a structure of a modification of the sixth embodiment of the present invention. In the structure shown in FIG. 18, in place of field region 414, there is provided a field region 424 formed by a highly doped n type impurity region. A lower well 422 is provided at a portion below a contact portion between field region 424 and contact 404a and in contact with field region 424. In the structure shown in FIG. 18, instead of the n+/p diode shown in FIGS. 17A and 17B, a field transistor (which may or may not have a gate electrode) is used as a high voltage conducting mechanism. Except this point, the structure is the same as that shown in FIG. 17B, and corresponding portions are denoted by the same reference characters.

In the structure shown in FIG. 18, when a transitional high voltage surge is generated at power supply line 402, the transitional high voltage surge is absorbed by conductive line 402 because of punch through phenomenon (conduction of parasitic bipolar transistor) of the field transistor. At this time, since lower well 420 for field region 424 and lower well 415 are provided, electric field concentration of field region 424 caused by the current flowing concentratedly at contact 404a as well as penetration of junction by the melt metal at contact 404a can be prevented, and an input protection mechanism having superior surge immunity can be implemented.

Also, in the structure shown in FIG. 18, a parasitic bipolar transistor may be formed in which lower wells 415 and 422 serve as collector and semiconductor substrate 422 serves as an emitter. If the conductivity types shown are all reversed and the substrate bias potential is set to the ground potential or a negative potential, an input protection circuit absorbing a negative high voltage surge to the ground line can be implemented.

As described above, according to the sixth embodiment of the present invention, the high voltage surge is absorbed by the semiconductor substrate or well region, utilizing a so called triple well structure. Therefore, the charges caused by the transitional high voltage surge can be stably absorbed by large parasitic capacitances of well regions and semiconductor substrate, and hence an input protection circuit having superior surge immunity can be implemented.

In the sixth embodiment, an MOS transistor may be used instead of a field transistor, to provide the same effect.

[Seventh Embodiment]

Figure 19A:
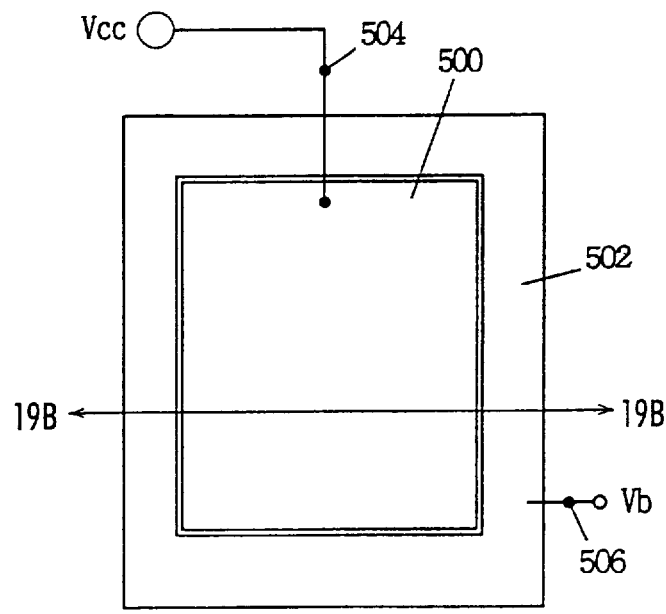
FIG. 19A is a planar layout of the input protection circuit in accordance with a seventh embodiment of the present invention, and FIG. 19B schematically shows a cross sectional structure taken along the line B–B' of FIG. 19A.
Figure 19B:
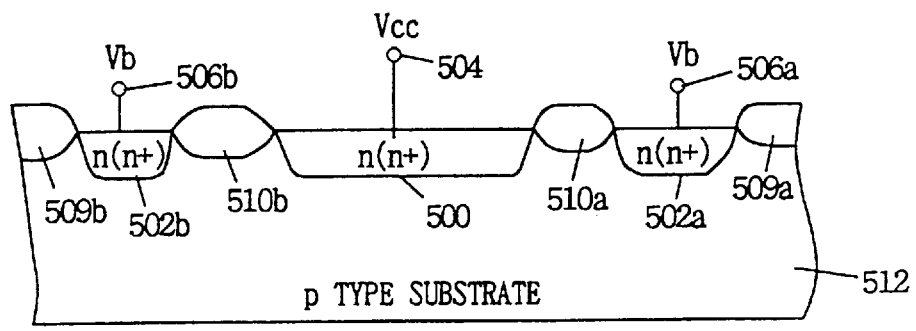

FIG. 19A schematically shows a planar layout of an input protection circuit portion according to the seventh embodiment of the present invention, and FIG. 19B schematically shows a cross sectional structure taken along the line B–B' shown in FIG. 19A. Referring to FIG. 19A, there are provided an impurity region 500 receiving the external power supply potential Vcc through a first node 504 and an impurity region 502 formed surrounding the impurity region 500 with a prescribed space (of at most about 3 $\mu$m) from a impurity region 500. Impurity region 500 may be a highly doped impurity region (diffusion region) or a lightly doped impurity region (well region). In the following description, the impurity region is used as referring to both the highly doped impurity region (diffusion region) and a lightly doped impurity region (well region).

Impurity region 502 is fixed at a bias potential Vb which is at the internal power supply potential or the ground potential, through a second node 506.

Referring to FIG. 19B, impurity region 500 is formed at a surface of a p type semiconductor substrate 512. Impurity region 500 is of n type conductivity. On both sides of impurity region 500, n type impurity regions 502a and 502b are formed, with field insulating films 510a and 510b interposed. Impurity regions 502a and 502b are formed continuously, and receives a bias potential Vb through nodes 506a and 506b, respectively. When the impurity region 500 is formed by well region, a portion to be connected to the first node 504 is formed by a highly doped impurity region (diffusion region). When impurity region 502a and 502b are formed by well regions, the portion to be connected to bias potential Vb is formed by a highly doped impurity region (diffusion region).

In the outer periphery of impurity regions 502a and 502b, LOCOS films 509a and 509b are formed.

In the structure shown in FIGS. 19A and 19B, when a transitional high voltage surge is generated at the first node 504, a punch through phenomenon is generated between impurity region 500 and impurity regions 502a and 502b thorough a regions below insulating films 510a and 510b breakthrough of junction between impurity region 500 and substrate 512), impurity region 500 is electrically connected to impurity regions 502a and 502b, and thus the transitional high voltage surge is absorbed by the second node 506a.

In the structure shown in FIGS. 19A and 19B, it is not necessary to arrange the power supply line and a conductive line parallel to each other, and an input protection circuit can be formed by utilizing impurity regions formed at the surface of the semiconductor substrate. Further, an impurity region 502 is formed along an outer periphery of impurity region 500, and hence the width of the regions through which the transitional high voltage surge current flows can be made sufficiently large. Therefore, a field transistor occupying small area but having sufficiently wide channel width can be equivalently formed at an arbitrary region at the surface of the semiconductor substrate, and accordingly, an input protection circuit having superior surge immunity and small area of occupation can be implemented.

[First Modification]

Figure 20:
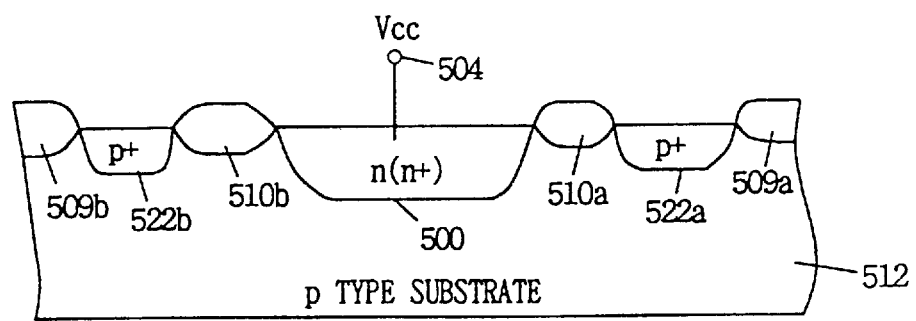
FIG. 20 schematically shows a structure of a first modification of the seventh embodiment of the present invention.

FIG. 20 shows a structure of a first modification of the seventh embodiment in accordance with the present invention. FIG. 20 shows only a cross sectional structure. Referring to FIG. 20, along an outer periphery of impurity region 500, highly doped p type impurity region 522a and 522b are formed with field insulating films 510a and 510b interposed. Highly doped p type impurity regions 522a and 522b are formed to surround impurity region 500, and hence planar layout thereof is the same as that shown in FIG. 19A. Except this point, the structure is the same as that shown in FIG. 19B, and corresponding portions are denoted by the same reference characters.

In the structure shown in FIG. 20, impurity regions 522a and 522b are electrically connected to p type semiconductor substrate 512. When a transitional high voltage surge is generated at the first node 504, breakthrough of junction (or punch through) occurs between the impurity regions 500 and impurity regions 522a and 522b, the current caused by the transitional high voltage surge flows from impurity region 500 to semiconductor substrate 512 and impurity regions 522a and 522b, and surge current flows from impurity regions 522a and 522b to semiconductor substrate 512. Thus, the surge current is absorbed by the substrate 512. Therefore, also in this case, the semiconductor substrate 512 has large stray capacitance and it can stably absorb the transitional high voltage surge. The semiconductor substrate 512 may be biased to a prescribed potential which corresponds to the ground potential, a negative potential or the internal power supply potential.

[Second Modification]

Figure 21A:
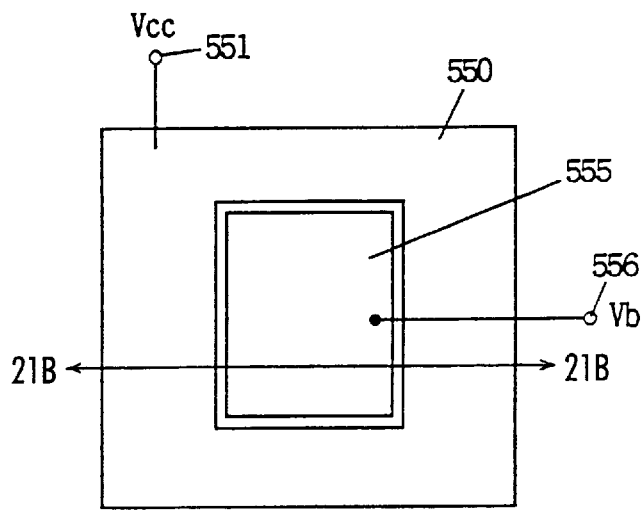
FIG. 21A is a planar layout of the first modification of the seventh embodiment of the present invention, and FIG. 21B schematically shows a cross sectional structure taken along the line 21B—21B of FIG. 21A.
Figure 21B:
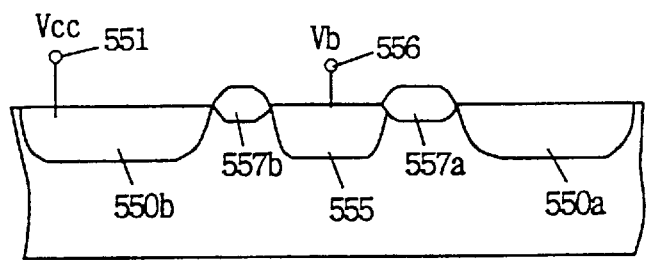

FIG. 21A shows a planar layout of a second modification of the seventh embodiment, and FIG. 21B shows a cross sectional structure taken along the line 21B—21B of FIG. 21A. Referring to FIG. 21A, inside an impurity region 550 receiving the external power supply potential Vcc through a first node 551, an impurity region 555 is provided which receives a prescribed bias potential Vb through the first node 551. Namely, in the structure in accordance with the second modification, along an outer periphery of impurity region 555 receiving bias potential Vb which is a negative potential, the ground potential, an internal power supply potential or an external power supply potential, an impurity region 555 receiving the external power supply potential Vcc is provided to surround the impurity region 555, with a small space therebetween.

Referring to FIG. 21B, outside the impurity region 555, impurity regions 550a and 550b are formed with impurity insulating films 557a and 557b interposed. Conductivity type of impurity region 555 and impurity regions 550a and 550b may be or may not be the same. In the structure shown in the second modification, when a transitional high voltage is generated at the first node 551, the transitional high voltage surge is absorbed through impurity region 555 and the second node 556 by a punch through phenomenon (or breakthrough). Therefore, as in the seventh embodiment and its first modification, an input protection circuit having superior surge immunity and small area of occupation can be implemented.

Figure 22:
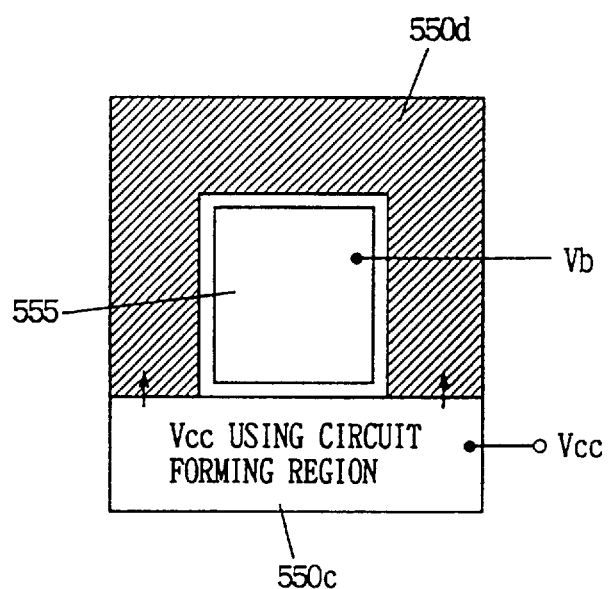
FIG. 22 schematically shows a structure of a second modification of the seventh embodiment of the present invention.

FIG. 22 shows a specific structure of a portion realizing planar layout of FIG. 21a. Referring to FIG. 22, impurity region 550 includes a Vcc using circuit forming region 550c in which a circuit portion utilizing the external power supply potential Vcc is formed, and an impurity region 550d electrically connected to an external power supply potential Vcc applying region (diffusion region or well region) of the Vcc using circuit forming region 550c. Internal circuit elements may not be formed in impurity region 550d. Further, what is required for the Vcc using circuit formed region 550c is simply an electrical connection with the external power supply potential Vcc applying region. Therefore, impurity region 550d may be a diffusion region or a well region. In this case, bias potential Vb may be applied to impurity region 555, and a separate internal circuit element may be formed in the region 555. In this case, along the circuit element forming region, an input protecting circuit may be formed. Therefore, an input protection circuit having sufficient layout area can be easily formed without increasing the area of occupation at all and without changing the layout. Thus, an input protection circuit having superior surge immunity can be provided.

As described above, according to the seventh embodiment of the present invention, a region to which an external power supply potential is applied, and a region electrically connected to a transitional high voltage surge absorbing portion are provided, with one surrounding the other. Therefore, even in a region having smaller area and not having power supply line, an input protection circuit having sufficient layout area can be easily formed, and hence an input protection circuit having superior surge immunity can be obtained.

[Eighth Embodiment]

Figure 23A:
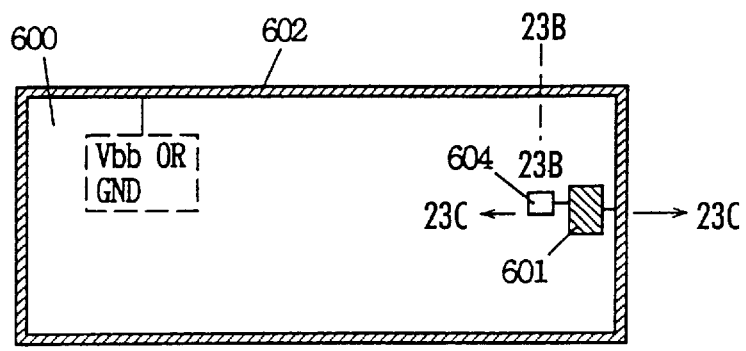
FIG. 23A shows a chip layout of the input protection circuit in accordance with an eighth embodiment of the present invention.
Figure 23B:
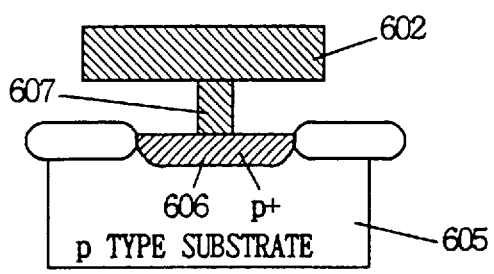
FIG. 23B shows a cross sectional structure taken along the line 23B—23B of FIG. 23A, and FIG. 23C schematically shows a cross sectional structure taken along the line 23C—23C.
Figure 23C:
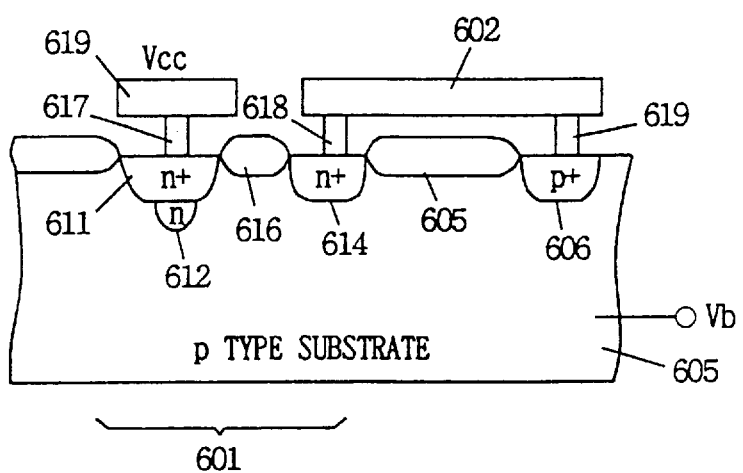

FIG. 23A shows a chip layout of a semiconductor device in accordance with the eighth embodiment of the present invention, FIG. 23B schematically shows a cross sectional structure taken along the line 23B—23B of FIG. 23A, and FIG. 23C schematically shows a cross sectional structure taken along the line 23C—23C of FIG. 23A.

Referring to FIG. 23A, along an outer periphery of a chip 600 on which a semiconductor device is formed, a conductive line 602 is arranged. As will be described later, conductive line 602 is electrically connected to the semiconductor substrate constituting the chip 600. The semiconductor substrate receives a reference potential from a reference potential generating means. The reference potential generating means is, if the substrate is of p type, a negative potential generating circuit generating a negative potential Vbb, or a ground line supplying the ground potential GND.

Conductive line 602 is coupled to a power supply pad 604 to which an external power supply potential is applied through an input protection circuit 601. The specific structure of the input protection circuit 601 will be any of the structures described with respect to the first to seventh embodiments.

Referring to FIG. 23B, at a surface of a p type semiconductor substrate 605 constituting semiconductor chip 600, a highly doped p type impurity region 606 is formed. Impurity region 606 is connected to conductive line 602 through a contact 607. Impurity region 606 is of the same conductivity type as semiconductor substrate 605, and hence impurity region 606 is electrically connected to semiconductor substrate 605. Therefore, conductive line 602 is electrically connected to semiconductor substrate 605 through impurity region 606.

Referring to FIG. 23C, input protection circuit 606 includes a conductive line (first node) 619 connected to power supply pad 604; a highly doped n type impurity region 611 formed at a surface of semiconductor substrate 605 and connected to conductive line 619 through a contact 617; a lightly doped n type impurity region (lower well) 612 formed below a contact portion between contact 617 and highly doped n type impurity region 611 and in contact with impurity region 611; and a highly doped n type impurity region 614 formed at the surface of semiconductor substrate 605 and connected to conductive line 602 through contact 618. Between the impurity regions 611 and 614, namely, between field regions 611 and 614, a field insulating film 616 is formed. Field regions 611 and 614 are formed to have sufficient widths and spaced from each other by a sufficiently small distance.

Conductive line 602 is connected to highly doped p type impurity region 606 formed at the surface of semiconductor substrate 605 through a contact 611. Between the field region (impurity region) 614 and the highly doped impurity region 606, an LOCOS film 615 is formed.

Conductive line 602 arranged along the outer periphery of chip 600 has sufficient length and sufficient width. Therefore, stray capacitance of conductive line 602 is sufficiently large, and therefore, the line can surely absorb the transitional high voltage surge generated at node 619. Further, conductive line 602 is connected to semiconductor substrate 605 fixed at a prescribed potential through impurity region 606, charges generated at conductive line 602 are absorbed by the semiconductor substrate 605, and hence fluctuation in the potential of conductive line 602 can surely be prevented.

In the eighth embodiment, field region 611 may not be a highly doped impurity region, but a well region to which external power supply potential Vcc is applied. The impurity region 606 may not necessarily be formed along the entire outer periphery of the chip, and it has only to be connected to conductive line 602 at an appropriate portion of chip 600.

In accordance with the eighth embodiment of the present invention, it is not necessary to provide a power supply line or a conductive line parallel to impurity regions 611 and 612 above these regions 611 and 612. What is necessary is that impurity regions 611 and 614 and the line portion formed on the impurity region 614 and connected to conductive line 602 have sufficient widths (in the direction vertical to the sheet of FIG. 23C) to immediately absorb the transitional high voltage surge. Therefore, the input protection circuit can be arranged near a region to which the external power supply potential is applied, in an empty region in the outer periphery of the chip without increasing the area of occupation at all. Therefore, an input protection circuit having superior surge immunity and small area of occupation can be implemented.

[Ninth Embodiment]

Figure 24A:
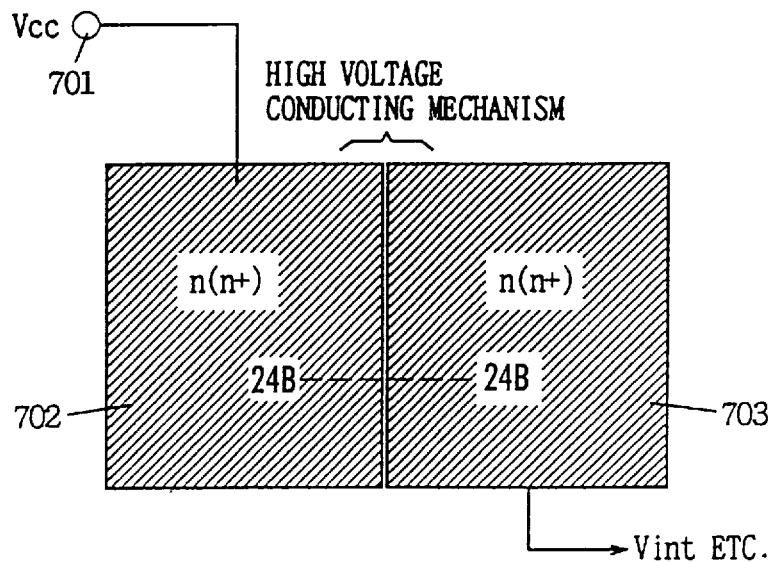
FIG. 24A is a planar layout of the input protecting circuit in accordance with a ninth embodiment of the present invention, and FIG. 24B schematically shows a cross sectional structure taken along the line A–A' of FIG. 24A.
Figure 24B:
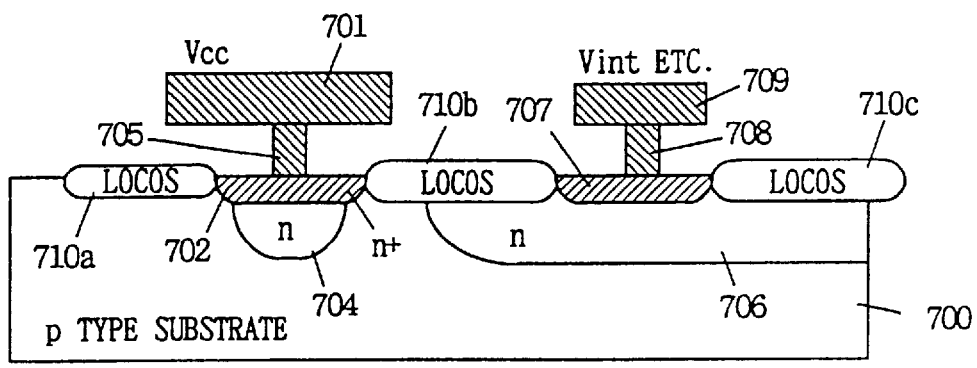

FIG. 24A is a planar layout of the input protection circuit in accordance with the ninth embodiment of the present invention, and FIG. 24B schematically shows a cross sectional structure taken along the line A–A' of FIG. 24A. Referring to FIG. 24A, the high voltage conducting mechanism includes an impurity region 702 receiving an external power supply potential Vcc through a first node 701, and an impurity region 703 arranged adjacent to and spaced from the impurity region 702. The impurity region 702 is a well region or a diffusion region in a region where a circuit element using the external power supply potential Vcc is formed. Impurity region 704 is a well region or a diffusion region where a circuit element which uses internal power supply potential Vint, ground potential or the like is formed. At an interface portion between impurity regions 702 and 703, a portion which is rendered conductive when a high voltage is applied is formed.

Referring to FIG. 24B, impurity region 702 is formed by a highly doped n type impurity region, and connected to a conductive line 701 which serves as a first node receiving the external power supply potential Vcc through a contact 705. Below the impurity region 702, a lower well 704 formed by a lightly doped n type impurity region is formed. The lower well 704 is formed below a contact portion of contact 705 and impurity region 702. Impurity region 703 includes a lightly doped n type well region 706 formed at the surface of p type semiconductor substrate 700 and a highly doped n type impurity region 707 formed at the surface of well region 706. The highly doped impurity region 707 is connected to a conductive line 709 transmitting a fixed potential such as internal power supply potential Vint through contact 708. The space between impurity region 702 and well region 706 is made sufficiently small, so as to cause a punch through between impurity region 702 and well region 706 when a transitional high voltage surge is generated. An LOCOS oxide film 710*b* is formed between impurity region 702 and well region 706, and LOCOS films 710*a* and 710*c* are formed on an outer periphery of impurity regions 702 and 707.

The n well region 706 is electrically connected to impurity region 707, and it is fixed at a fixed potential, which corresponds to the ground potential or the internal power supply potential Vint applied through a conductive line (second node) 709. In well region 706, a circuit using a fixed potential such as the internal power supply potential Vint is formed. When a transitional high voltage surge is generated at the first node 701, a punch through occurs between impurity region 702 and well region 706, the transitional high voltage surge flows from impurity region 702 to well region 706, and, thereafter, flows to the second node 709 through impurity region 707 to be absorbed by a fixed potential generating means connected to the second node 709. Therefore, in the structure of the ninth embodiment, the transitional high voltage surge can be surely absorbed. Further, it is not necessary to arrange external conductive lines transmitting power supply potentials such as the external power supply line and an internal power supply line parallel to each other over a long distance. Therefore, degree of freedom in circuit layout can be increased. Further, since impurity regions 702 and 703 are arranged parallel to each other over a long distance, the channel width (orthogonal direction of line A–A') of the high voltage conducting mechanism can be made sufficiently large, and hence input protection circuit having superior surge immunity can be implemented.

Figure 25:
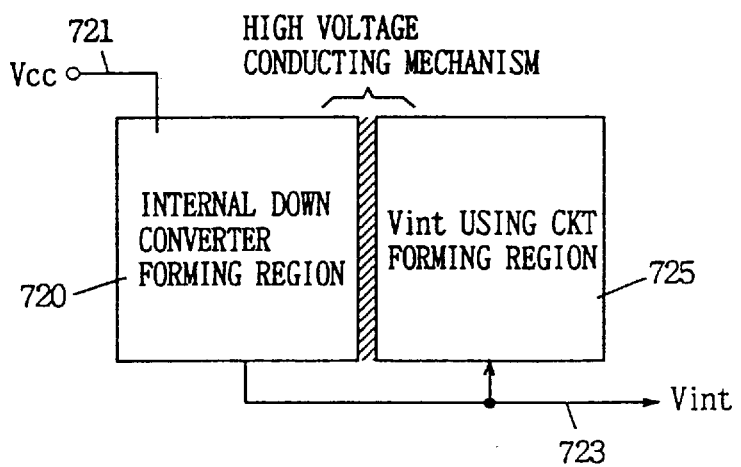
FIG. 25 shows a specific example of a circuit in which an impurity region shown in FIG. 24 is formed.
Figure 26A:
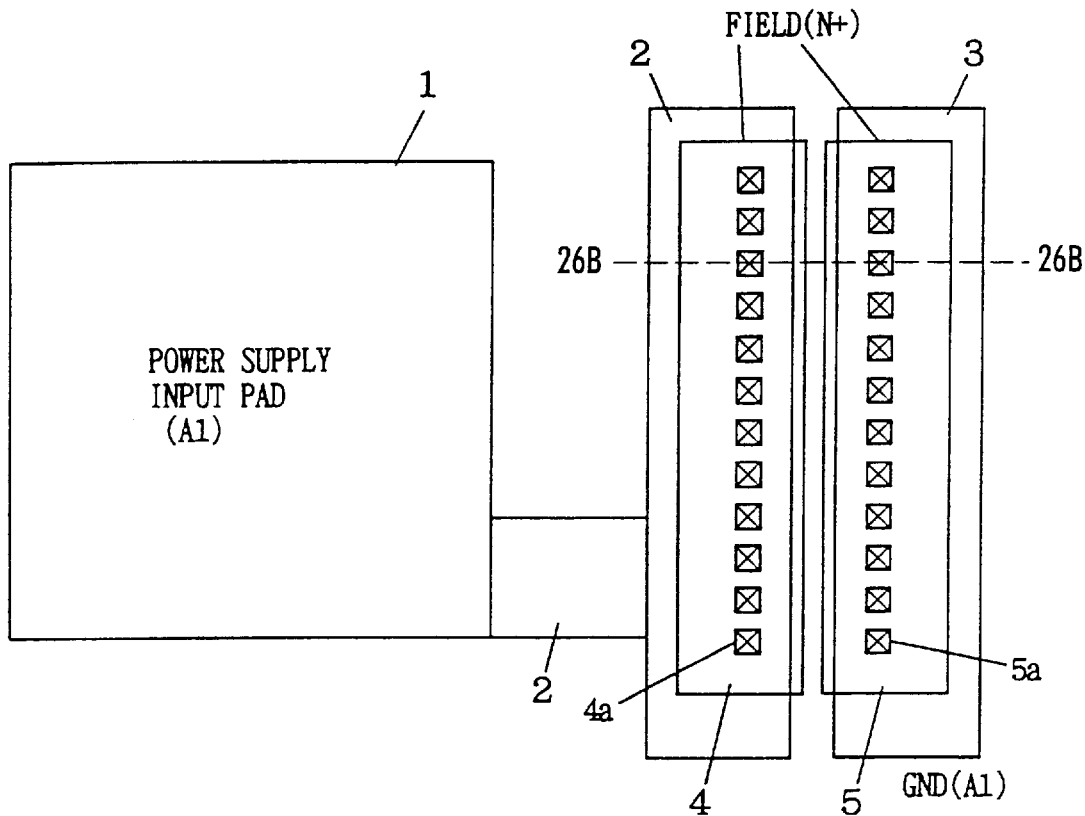
FIG. 26A is a planar layout of a conventional input protection circuit, and FIG. 26B schematically shows a cross sectional structure taken along the line A–A' of FIG. 26A.
Figure 26B:
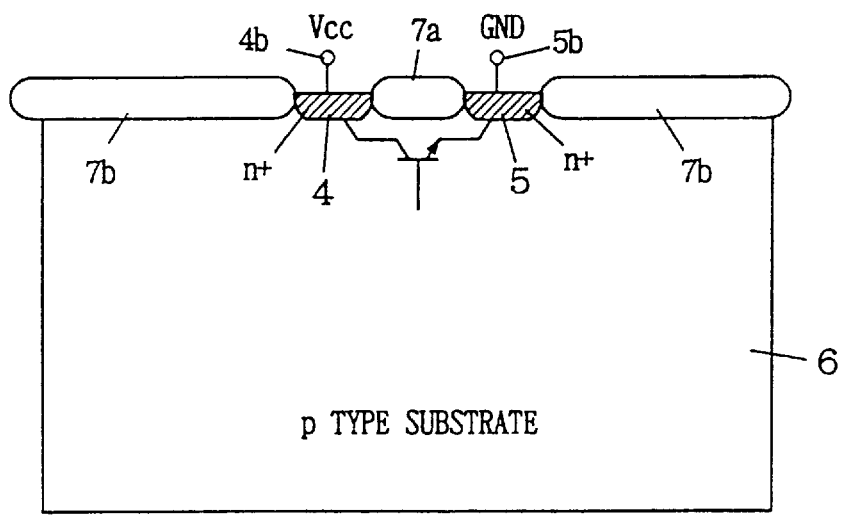
Figure 27:
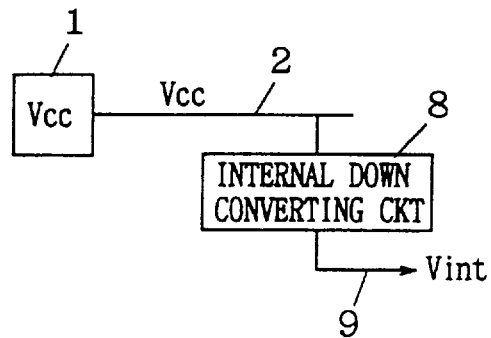
FIG. 27 schematically shows a layout of a conventional external power supply line and an internal power supply line.
Figure 28:
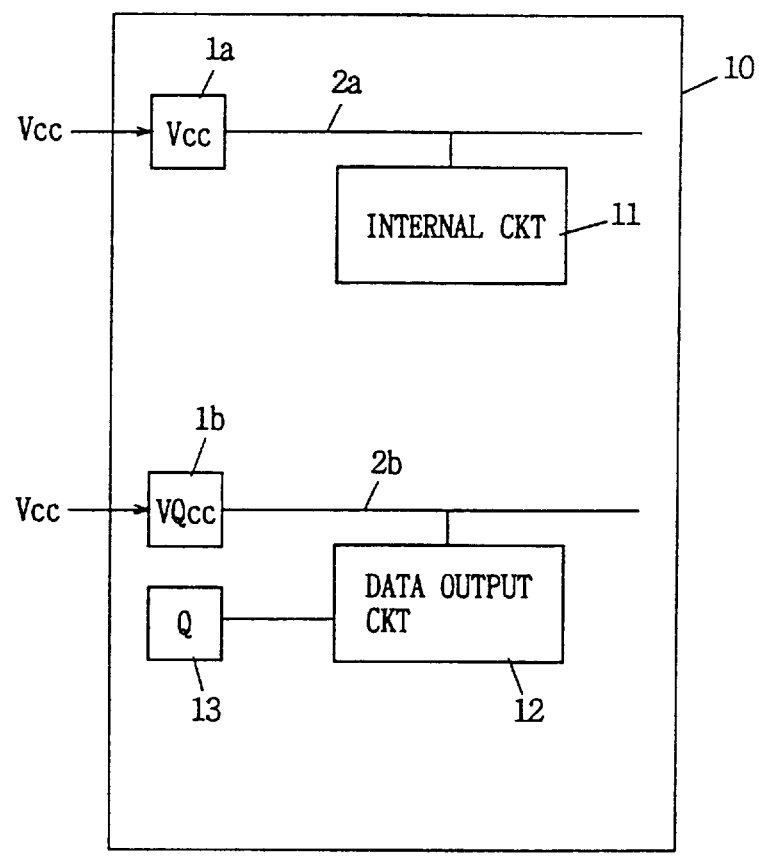
FIG. 28 schematically shows a layout of a power supply line in a conventional semiconductor memory device.

FIG. 25 shows a specific example of circuit elements formed in impurity regions 702 and 703. Referring to FIG. 25, there are provided a region 720 in which an internal down converting circuit for converting the external power supply potential Vcc applied at the second node 721 to generate an internal power supply potential Vint is formed, and adjacent thereto, a region 725 in which a circuit receiving the internal power supply potential Vint through internal power supply line 723 and operates using this potential is formed. In internal down converting circuit forming region 720, as already shown in FIG. 2, a drive transistor is formed by a p channel MOS transistor. If a comparing circuit 105 is a circuit of a current mirror type, the current mirror circuit is also formed by p channel MOS transistor. Since such a p channel MOS transistor receives at one conduction node the external power supply potential Vcc, the n type well region in which p channel MOS transistor is formed is biased to the external power supply potential Vcc. Therefore, the well region is used as the impurity region 702 shown in FIG. 24A. The circuit using the internal power supply potential Vint operates using the internal power supply potential Vint. In this case, the region where the p channel MOS transistor is formed is similarly an n type well region. Therefore, n type well region is biased to the internal power supply potential Vint. Since these well regions are used as impurity regions 702 and 703 shown in FIG. 24A, the high voltage conducting mechanism shown by the hatched portion in FIG. 25 can be readily provided.

Further, the region 720 may be a data output circuit forming region, and the region 725 may be a region in which an internal data reading circuit such as a preamplifier amplifying an internal read data to apply the amplified data to the data output circuit is formed.

As described above, according to the ninth embodiment, a circuit region utilizing a fixed potential such as an internal power supply potential is arranged adjacent to a region which uses an external power supply potential, and an interface between these regions is used as the high voltage conducting mechanism. Therefore, a high voltage conducting mechanism having sufficient width can be formed, and hence an input protection circuit having superior surge immunity and small area of occupation can be realized. Further, simply the circuit element forming regions are utilized, so that it is not necessary to provide a region dedicated for the input protection circuit, and hence layout becomes more flexible.

In the first to ninth embodiments, when conductivity types of the impurity regions are reversed, a mechanism for absorbing a negative high voltage surge with respect to the ground potential, instead of the external power supply potential, can be realized.

As described above, in accordance with the present invention, a fixed potential transmitting line or a circuit forming region is utilized as a high voltage conducting mechanism for absorbing surge. Therefore, it is not at all necessary to provide a region dedicated for the input protection mechanism, and hence an input protection circuit having superior surge immunity and small area of occupation can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An input protection circuit for a semiconductor device, comprising:

a first power supply node on a first power supply line coupled to receive an externally applied power supply voltage at a first level;

a second power supply node on a second power supply line coupled to receive a power supply voltage corresponding to said externally applied power supply voltage and different from a ground voltage; and a high voltage conducting mechanism having a first node coupled to said first power supply node and a second node coupled to said second power supply node, and responsive to a voltage, applied to said first power supply node, being at a second level greater than the first level, for being rendered conductive to electrically connect said first and second nodes with each other.

2. The input protection circuit according to claim 1, further comprising:

internal power supply voltage generating means for receiving the externally applied power supply voltage supplied from said first power supply node and providing an internal power supply voltage on said second power supply node.

3. The input protection circuit according to claim 1, wherein said second power supply node is coupled to receive another externally applied power supply voltage the same in potential as the power supply voltage applied to said first power supply node.

4. The input protection circuit for a semiconductor device according to claim 1, wherein said high voltage conducting mechanism includes a first impurity region formed at a surface of a semiconductor substrate region and connected to said first node, and a second impurity region arranged at the surface of said semiconductor substrate region adjacent to and spaced from said first impurity region, and electrically connected to said second node.

5. The input protection circuit according to claim 4, wherein said high voltage conducting mechanism further includes a field insulating film formed between said first and second impurity regions, for normally isolating said first and second impurity regions.

6. The input protection circuit according to claim 4, wherein said high voltage conducting mechanism further includes a gate electrode layer formed on said semiconductor substrate region between said first and second impurity regions with an insulating film interposed, and connected to one of said first and second nodes.

7. The input protection circuit for a semiconductor device according to claim 4, wherein said high voltage conducting mechanism further includes a conductive line provided between said first node and said first impurity region, for electrically connecting said first node and said first impurity region, and an island-shaped impurity region having a common conductivity type as said first impurity region and lower impurity concentration than that of said first impurity region, formed outside and in contact with said first impurity region and at least at a region below a contact portion between said first impurity region and said conductive line.

8. The input protection circuit according to claim 4, wherein said first and second impurity regions have a first conductivity type, and said semiconductor substrate region has a second conductivity type different from said first conductivity type.

9. The input protection circuit according to claim 4, wherein said first impurity region has a first conductivity type, and said second impurity region and said semiconductor substrate region have a second conductivity type different from said first conductivity type.

10. The input protection circuit according to claim 3, wherein said semiconductor device includes a data output circuit which operates using the externally applied power supply voltage applied to one of said first and second nodes as one operational power supply voltage, for outputting a received data externally.

11. The input protection circuit for a semiconductor device according to claim 3, wherein said semiconductor device comprises:

a plurality of memory cells each storing data;

a sense amplifier for sensing and amplifying data stored in a selected one of said plurality of memory cells when activated; and sense activating means responsive to a sense activating signal for transmitting the externally applied power supply voltage applied to one of said first and second nodes to said sense amplifier.

12. An input protection circuit for a semiconductor device, comprising:

an external power supply pad receiving an external power supply voltage at a first level; and a high voltage conducting means having a first node connected to said external power supply pad and a second node coupled to a semiconductor substrate region, and rendered conductive in response to a surge voltage at a second level, greater than the first level, being applied to said first node, for electrically connecting said first and second nodes with each other to absorb said surge voltage in said semiconductor substrate region, said semiconductor substrate region is coupled to a bias source and receives a bias voltage different from a ground voltage therefrom.

13. The input protection circuit for a semiconductor device according to claim 12, wherein said high voltage conducting means includes a first impurity region formed at a surface of said semiconductor substrate region and connected to said first node and having different conductivity type from that of said semiconductor substrate region, and a second impurity region arranged adjacent to and apart from said first impurity region and having a common conductivity type as said semiconductor substrate region.

14. The input protection circuit for a semiconductor device according to claim 12, wherein said high voltage conducting means includes a plurality of junction interfaces formed by regions of different conductivity types formed between said first node and the semiconductor substrate region connected to said second node.

15. The input protection circuit according to claim 12, wherein said high voltage conducting means includes a first impurity region of a first conductivity type connected to said first node, a second impurity region of the first conductivity type having lower impurity concentration than said fist impurity region, formed in contact with a lower portion of said first impurity region, and a third impurity region of a second conductivity type formed below said first and second impurity regions on said semiconductor substrate region to surround said first and second impurity regions.

16. The input protection circuit for a semiconductor device according to claim 1, wherein said high voltage conducting means includes a first substrate region connected to said first node and having a circuit element using said externally applied power supply voltage formed thereon, and a diffusion region arranged adjacent to and spaced from said substrate region in planar layout, and connected to said second node.

17. The input protection circuit according to claim 16, wherein the circuit element formed on said first substrate region includes internal power supply voltage generating means for receiving the externally applied power supply voltage and generating an internal power supply voltage, and said diffusion region is electrically connected to a region where an internal circuit utilizing said internal power supply voltage is formed.

18. The input protection circuit for a semiconductor device according to claim 16, wherein said diffusion region is formed to surround said first substrate region.

19. The input protection circuit for a semiconductor device according to claim 16, wherein said diffusion region is formed within said first substrate region.

20. The input protection circuit according to claim 1, wherein said input protection circuit and said semiconductor device are formed on a common semiconductor chip, and said second node is electrically coupled to the semiconductor chip.

21. The input protection circuit according to claim 20, wherein said second node is coupled to the semiconductor chip through a conductor line arranged along an outer periphery of the semiconductor chip and electrically connected to the chip.

* * * * *

UNITED STATES PATENT AND TRADEMARK OFFICE
CERTIFICATE OF CORRECTION

PATENT NO. : 5,847,430
DATED : December 8, 1998
INVENTOR(S) : Hideto Hidaka

It is certified that error appears in the above-identified patent and that said Letter Patent is hereby corrected as shown below:

Column 6, line 11, change "B-B'" to -- 19B-19B --;

Column 21, line 35, change "B-B'" to -- 19B-19B --;

Claim 12, line 14, change "is" to -- being --;

Claim 12, line 15, change "receives" to -- receiving --;

Claim 16, line 3, change "means" to -- mechanism --;

Claim 16, line 8, insert -- first -- before "substrate.

Signed and Sealed this

Fifteenth Day of June, 1999

Attest:

Q. TODD DICKINSON

*Attesting Officer*  *Acting Commissioner of Patents and Trademarks*